United States Patent
Dagher et al.

(10) Patent No.: US 9,809,007 B2
(45) Date of Patent: Nov. 7, 2017

(54) COMPOSITE WELDABLE PANEL WITH EMBEDDED DEVICES

(71) Applicant: University of Maine System Board of Trustees, Bangor, ME (US)

(72) Inventors: Habib J. Dagher, Veazie, ME (US); Eric D. Cassidy, Easton, ME (US); Anthony M. Viselli, Bangor, ME (US); Bruce Segee, Old Town, ME (US)

(73) Assignee: University of Maine System Board of Trustees, Bangor, ME (US)

( * ) Notice: Subject to any disclaimer, the term of this patent is extended or adjusted under 35 U.S.C. 154(b) by 0 days.

(21) Appl. No.: 15/209,824

(22) Filed: Jul. 14, 2016

(65) Prior Publication Data

US 2017/0043559 A1 Feb. 16, 2017

Related U.S. Application Data

(62) Division of application No. 14/484,999, filed on Sep. 12, 2014, now Pat. No. 9,396,635, which is a division
(Continued)

(51) Int. Cl.
*B32B 21/08* (2006.01)
*B65D 90/02* (2006.01)
(Continued)

(52) U.S. Cl.
CPC ............... *B32B 21/08* (2013.01); *B32B 3/06* (2013.01); *B65D 88/12* (2013.01); *B65D 90/02* (2013.01); *B65D 90/022* (2013.01); *B65D 90/023* (2013.01); *B65D 90/08* (2013.01); *B65D 90/48* (2013.01); *G01D 5/16* (2013.01); *G01M 11/332* (2013.01); *G01R 31/021* (2013.01); *G01R 31/025* (2013.01); *G08B 13/26* (2013.01); *B32B 2262/101* (2013.01); *B32B 2439/40* (2013.01); *B65D 2101/00* (2013.01); *Y10T 428/16* (2015.01); *Y10T 428/161* (2015.01); *Y10T 428/18* (2015.01); *Y10T 428/183* (2015.01);
(Continued)

(58) Field of Classification Search
CPC ....................................................... A47L 23/26
USPC .......................................................... 428/54
See application file for complete search history.

(56) References Cited

U.S. PATENT DOCUMENTS

| | | | |
|---|---|---|---|
| 3,332,216 A | 7/1967 | Stern | |
| 3,779,448 A | 12/1973 | Wootten | |

(Continued)

FOREIGN PATENT DOCUMENTS

| | | |
|---|---|---|
| WO | 2006019929 A2 | 2/2006 |
| WO | 2006083453 A2 | 8/2006 |

OTHER PUBLICATIONS

International Search Report, Application No. PCT/US07/21231 dated Mar. 11, 2008.

*Primary Examiner* — Brent O'Hern
(74) *Attorney, Agent, or Firm* — MacMillan, Sobanski & Todd, LLC

(57) ABSTRACT

A hybrid composite panel suitable for forming a container includes a wood layer and a fiber-reinforced polymer composite layer having a sensor system embedded therein. The wood layer is laminated plywood that includes at least one of hard and soft wood, solid-sawn tongue-and-groove hardwood planks, and partially laminated solid-sawn hardwood.

7 Claims, 23 Drawing Sheets

Related U.S. Application Data of application No. 11/866,655, filed on Oct. 3, 2007, now Pat. No. 8,865,285.

(60) Provisional application No. 60/872,956, filed on Dec. 4, 2006, provisional application No. 60/850,300, filed on Oct. 6, 2006, provisional application No. 60/927,233, filed on May 2, 2007.

(51) Int. Cl.
| | | |
|---|---|---|
| *B65D 90/08* | (2006.01) | |
| *B65D 88/12* | (2006.01) | |
| *B65D 90/48* | (2006.01) | |
| *G01M 11/00* | (2006.01) | |
| *G01R 31/02* | (2006.01) | |
| *G08B 13/26* | (2006.01) | |
| *B32B 3/06* | (2006.01) | |
| *G01D 5/16* | (2006.01) | |

(52) U.S. Cl.
CPC .... *Y10T 428/187* (2015.01); *Y10T 428/24995* (2015.04)

(56) References Cited

U.S. PATENT DOCUMENTS

| | | |
|---|---|---|
| 5,139,845 A | 8/1992 | Beckerman et al. |
| 2003/0116678 A1 | 6/2003 | Gardner |
| 2007/0037462 A1* | 2/2007 | Allen .................... D03D 15/00 442/5 |

* cited by examiner

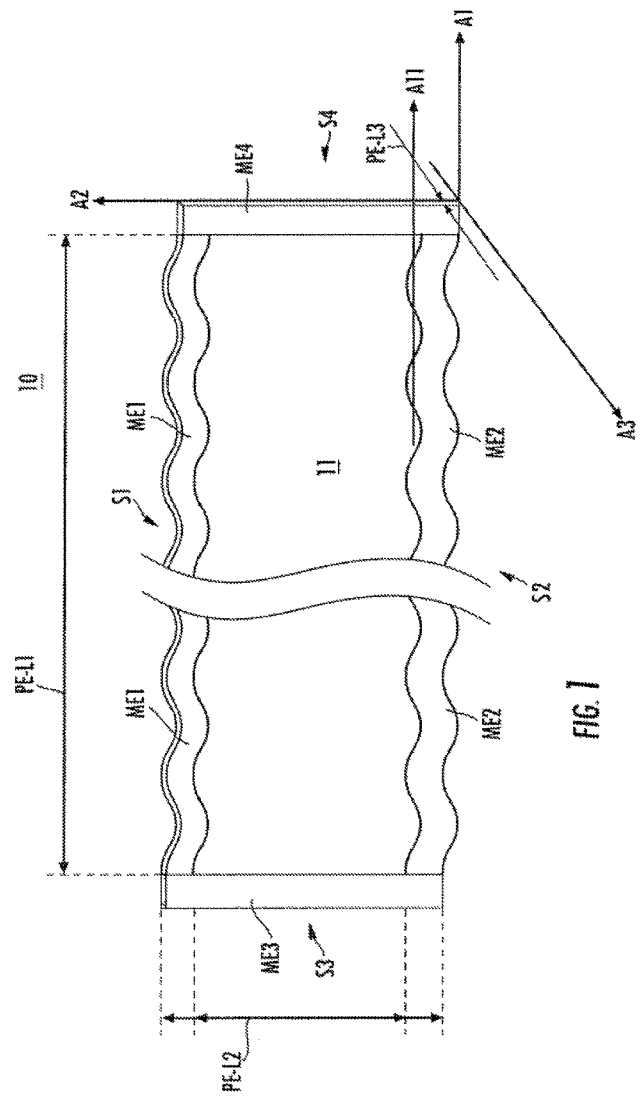

COMPOSITE WELDABLE PANEL WITH EMBEDDED DEVICES

This invention was made with U.S. Government support under Contract No. N66001-05-C-6014 awarded by the United States Navy. The United States Government has certain rights in this invention.

BACKGROUND OF THE INVENTION

The present invention relates to containers and more particularly to secure containers that can withstand attempts at intrusion. There has been a recognition that the United States is at risk of the delivery of weapons of mass destruction to its ports by enemies employing a strategy of hiding such a weapon in a shipping container. Various schemes have been proposed for X-raying containers or otherwise examining containers as they are loaded on ships in foreign ports. Such schemes, however, can be very limited in effectiveness since they can be defeated with X-ray shielding, are vulnerable to compromise by rogue employees and the contents of the containers may be altered after they are loaded in a foreign port.

Approximately sixteen million twenty foot containers are in use throughout the world. Additionally, approximately 40% of the personnel that load and off-load these containers come from nations that are on the terrorist list. Bribery and sabotage are common throughout the shipping industry, including government officials, shipping companies and freight forwarders. Large quantities of contraband material now pass through the maritime commerce into most ports in the U.S.

The current shipping containers are primarily made of steel with considerable drawbacks. The steel containers increase shipping weight unnecessarily, wear out quickly, and can be infiltrated by simple means. Other panels not made of steel have been considered, but they are typically not made of weldable material. Without a strong weld, a container is susceptible to intrusion.

To a limited degree, the notion of enclosing in containers detecting devices that communicate with external systems, such as sensors or processors, has been implemented in unsecure applications. For example, Sensitech, based in Beverly, Mass. (www.sensitech.com), provides solutions in the food and pharmaceuticals fields that are used for monitoring temperature and humidity for goods in-transit, in-storage, and on display. Such temperature and humidity monitors are typically placed in storage and transit containers to monitor if desired conditions are maintained.

Such environmental data is used for ensuring that products in a container do not spoil by being subjected to unfavorable temperature and humidity conditions. Secure communications, tamper resistance, and detection are not particularly relevant issues in such settings. Additionally, such monitors do not monitor for the presence of suspicious content or materials, no matter where they may be introduced in the transportation or supply chain.

Even if detectors are introduced into a container and interfaced to an external system, an enemy may employ any of a variety of strategies to defeat such a detection system. For instance, an enemy may attempt to shield the suspicious materials or activities from the detectors; defeat the communication interface between the detectors and the external system, so that the interface does not report evidence of suspicious materials or activities sensed by the detectors; disconnect the detectors from the interface; surreptitiously load a container that contains an atomic weapon, but that does not contain detecting devices, onto a container ship; and overcome external systems so that they incorrectly report on the status of the detectors. This invention is related to U.S. Pat. No. 8,531,292, issued Sep. 10, 2013 and U.S. Provisional Patent Application No. 60/587,803, filed on Jul. 14, 2004, both of which are incorporated herein by reference in their entireties.

The present invention relates to a method of manufacturing, distributing, and utilizing shipping containers such that they may be monitored for unauthorized access. The present invention also relates to methods of making and using inherently secure shipping containers that improve shipping processes and provide a savings in the cost of transportation, increased control, faster throughput, and reduction of losses due to pilferage.

SUMMARY OF THE INVENTION

The present invention relates to a panel comprising multilayered composite material that can be welded to other components, for example to a frame or to one or more panels to form a tamper-resistant container, such as a shipping container. In addition, the panel may contain embedded processors and sensors that can detect any intrusion or tampering with the container.

In one embodiment of the present invention, a hybrid composite panel suitable for forming a container includes a wood layer and a fiber-reinforced polymer composite layer having a sensor system embedded therein. The wood layer is laminated plywood that includes at least one of hard and soft wood, solid-sawn tongue-and-groove hardwood planks, and partially laminated solid-sawn hardwood.

Other advantages of the invention will become apparent to those skilled in the art from the following detailed description, when read in view of the accompanying drawings.

BRIEF DESCRIPTION OF THE DRAWINGS

FIG. 1 illustrates a front perspective view of a panel made of multilayered composite material into weldable edges, in accordance with the invention;

DETAILED DESCRIPTION OF THE INVENTION

A description of exemplary embodiments of the invention follows.

Figure 12:
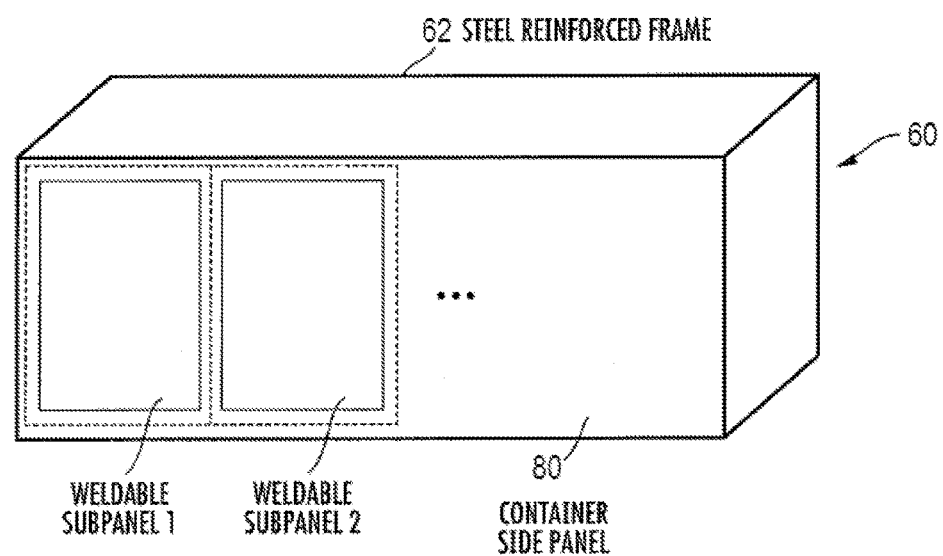
FIG. 12 illustrates a front right perspective view of a container including weldable composite sub-panels.
Figure 12A:
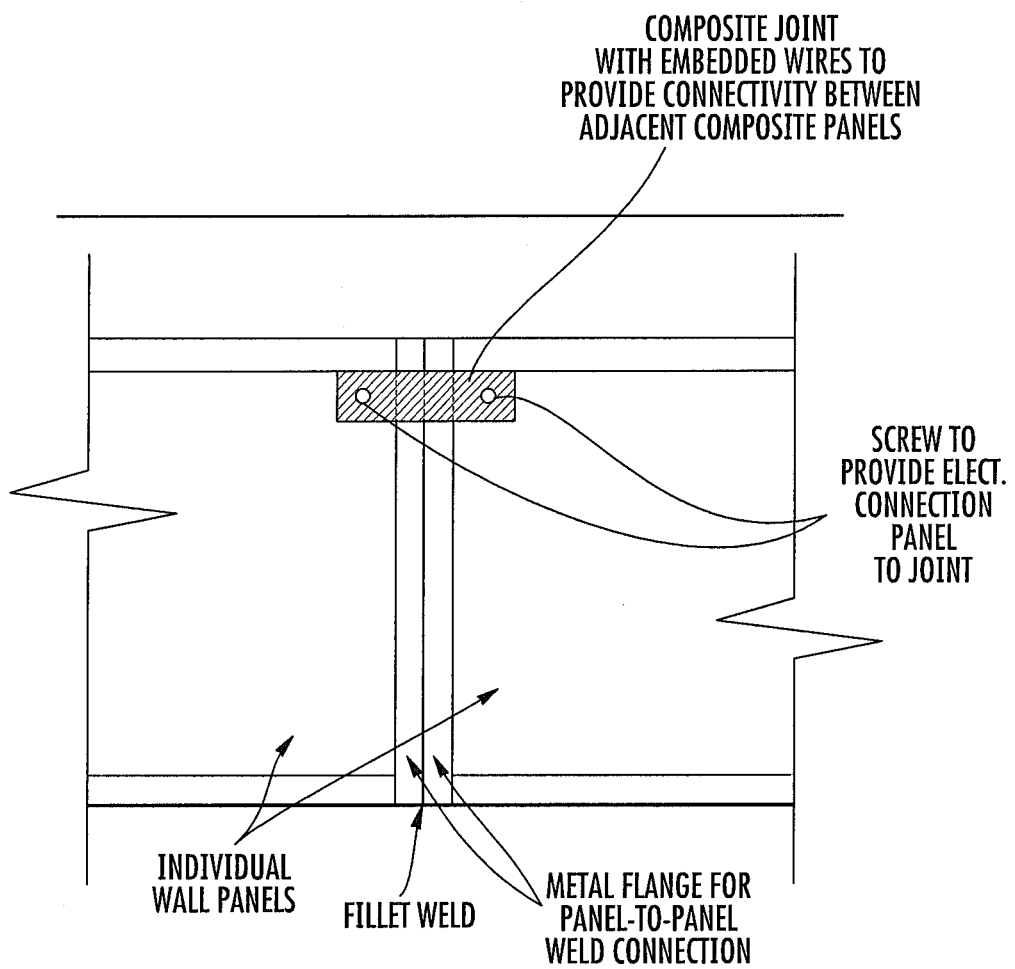
FIG. 12A illustrates a plan view of two adjacent composite subpanels joined together and including a jumper for electrically interconnecting embedded conductors of the adjacent subpanels.

The present invention relates to a panel comprising a panel element formed by a multilayered composite material with edge elements extending from its periphery. The edge elements are formed of a weldable material, such as steel to define a weldable panel. In the exemplary weldable panels described herein, the edge elements of the panels may be welded to edge elements of a similar panel, as shown in FIGS. 12 and 12A (or to a frame, as shown in FIGS. 12, 13, and 14A-C) to form a tamper-resistant container, such as a shipping container. The panels may be used for other purposes, such as a multi-panel wall. The panel elements may contain embedded processors or sensors that detect any intrusion or tampering with the panels.

In one embodiment of the present invention, a panel element is composed of a fiber-reinforced polymer composite material. The reinforced polymer structure may comprise multiple layers of unidirectional fabric in various orientations randomly oriented fabric or woven fabric encased in a resin matrix. In one embodiment, the reinforced polymer structure may consist of E-glass/vinylester composite ("E-glass Composite"), E-glass Composite has specific strength, impact, and durability properties that exceed those of conventional steel.

Now referring to FIG. 1, an exemplary panel 10 is schematically illustrated with respect to an orthogonal coordinate system formed by axes A1, A2, and A3. The panel 10 includes a central composite panel element 11 having a four-sided rectangular peripheral edge PE. Two of the four sides edges S1, S2 are mutually opposite and extend along a first axis A1, having lengths PE-L1. Two of the four sides S3, S4 are mutually opposite and extend along a second axis A2, having lengths PE-L2. The panel 10 has a substantially uniform thickness PE-L3 along a third axis A3. The panel 10 has a corrugated profile along axis A1, and a linear profile along axis A2.

Figure 1A:
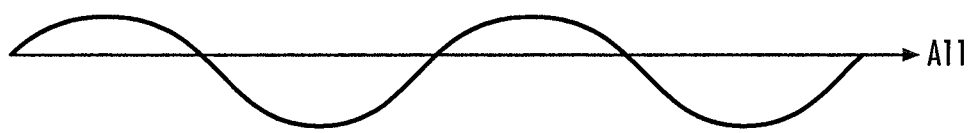
FIGS. 1A and 1B illustrate exemplary corrugation profiles of the panel at FIG. 1.
Figure 1B:
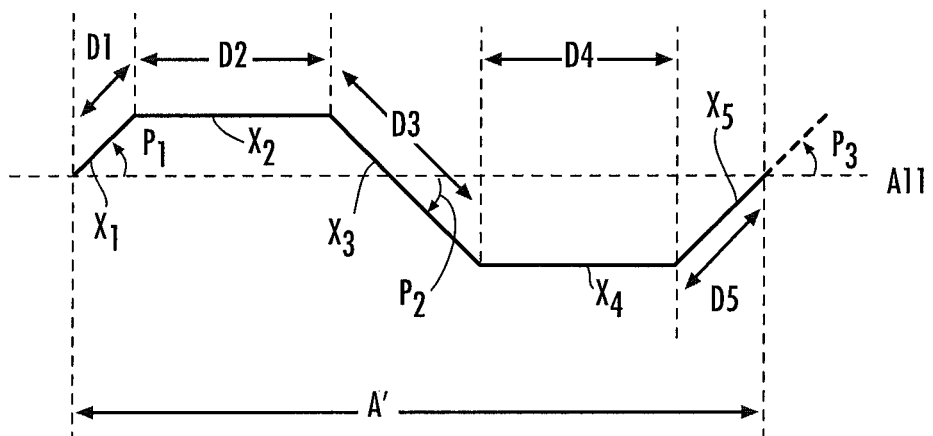

The corrugated profile of sides S1, S2 of the panel 10 is preferably symmetrical about an axis A11 parallel to A1, as shown in FIG. 1A. An asymmetrical corrugation profile may be employed in other embodiments. An exemplary sinusoidal corrugation profile is illustrated in FIG. 1A. An exemplary piecewise linear corrugation profile is illustrated in FIG. 1B; while the junctions of the respective adjacent segments are shown as "sharp," it will be understood that gradual curved junctions are within the scope of "piecewise linear" as used herein in FIG. 1B. The corrugated profile has a piecewise linear repeating pattern $X_1$-$X_2$-$X_3$-$X_4$-$X_5$, wherein $X_1$ extends a distance D1 at a positive non-zero angle $P_1$ from A11. $X_2$ extends a distance D2 parallel to A11. $X_3$ extends a distance D3 at a negative non-zero angle $P_2$. $X_4$ extends a distance D4 parallel to A11 and $X_5$ extends a distance D5 at a positive non-zero angle $P_3$ to A11. In one embodiment, it should be noted that D2=D4 and D1=D5=½ D3 and $P_1$=$P_3$=$P_2$.

Preferably, D1 sin P1 is in the range 0.25 in. to 4.0 in, D2 and D4 are in the range 1.5 in. to 8.5 in. and P1 is in the range 20 degrees to 90 degrees. There are three preferred forms of this geometry. The first preferred form has dimensions D1 sin P1=1.42 in., D2=2.75 in and P1=27.9.degrees. The second preferred form, has dimensions D1 sin P1=1.80 in., D2=4.33 in and P1=68.5.degrees. The third preferred form, has dimensions D1 sin P1=0.79 in., D2=6.00 in and P1=57.degrees. In yet another form as may be used for a side wall, the dimensions D1 sin P1=2.0 in., D2=2.75 in., and P1=47.degrees.

The panel 10 includes a first elongated edge element ME1 affixed to and extending from and along the first side edge S1, wherein the first edge element ME1 has a corrugated profile along the first axis A1. A second elongated edge element ME2 is affixed to and extends from and along the second side edge S2, wherein the second side edge element ME2 has a corrugated profile along first axis A1. The corrugation profiles of edge elements ME1 and ME2 match the corrugation profile of panel element 11.

A third elongated edge element ME3 is affixed to and extends from and along the third side edge S3, wherein third side edge element ME3 has linear profile along second axis A2. A fourth elongated edge element ME4 is affixed to and extends from and along the fourth side edge S4, wherein fourth edge element ME4 has a linear profile along second axis A2. The first edge element ME1, second edge element ME2, third edge element ME3, and fourth edge element ME4 are composed of weldable metal, such as steel.

Figure 2A:
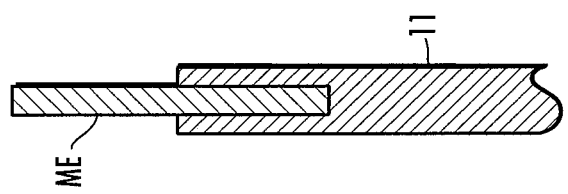
FIGS. 2A-2G illustrate exemplary configurations for metal edges bonded to composite panel elements of the panel of FIG. 1.
Figure 2B:
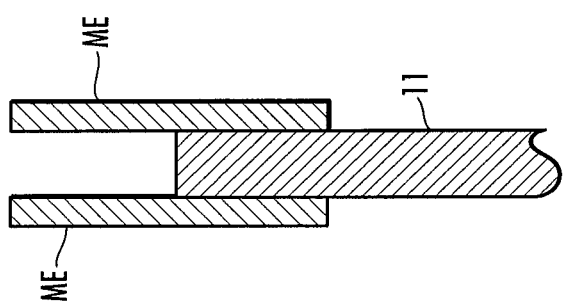
Figure 2C:
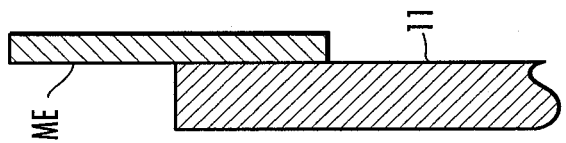

The edge elements (ME) may be joined to the edges of panel element 11 in various manners. For example, the edge elements may be embedded in the edge of a panel as illustrated in FIG. 2C. The edge element (ME) may alternatively be attached to a surface of an edge of the panel element, as shown in FIG. 2A. The edge elements (ME) may alternatively be bonded to the opposite surfaces of the edge of panel element 11 to provide a "sandwich" structure as shown in FIG. 2B. To secure the edge element to the composite panel element, an adhesive, mechanical fastener, or both may be used to bond the edge element to the composite panel element.

Figure 2D:
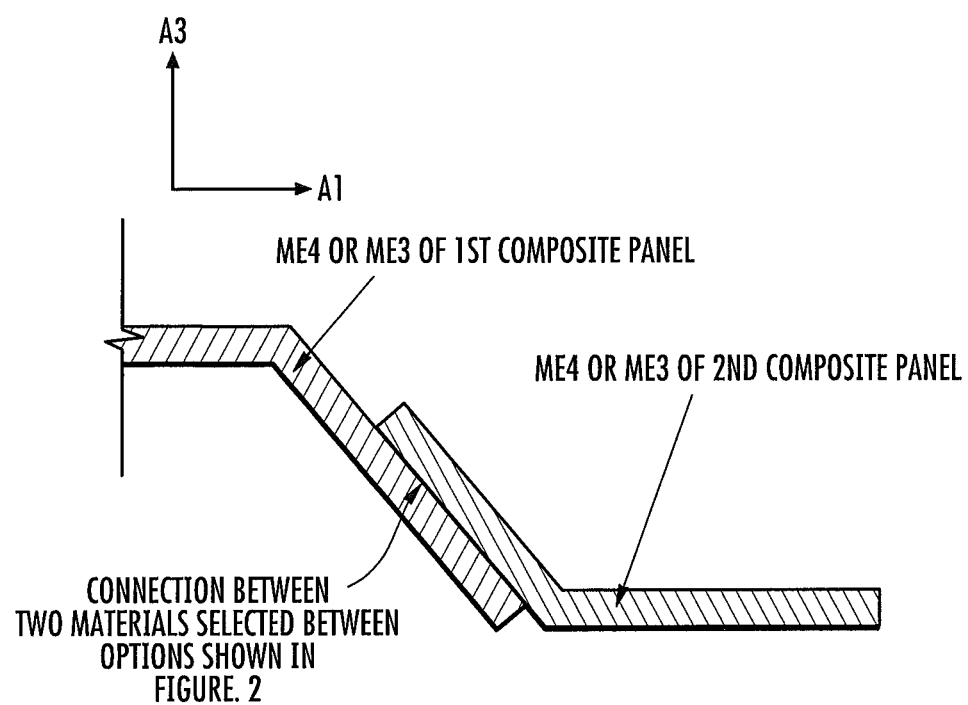

In some embodiments, the edge elements (ME) follow the contour of the surface respective surface. Referring to FIG. 2D, an edge view of a connection between two adjacent corrugated composite panels is shown. The edge elements ME3 and ME4 are angled in a complementary manner, such that an edge element ME3 of a first panel overlaps a complementary edge element ME4 of a second adjacent panel. The overlapping joint can be formed using any of the options shown in FIGS. 2A through 2C. Thus, the resulting joint may reside along an equivalent D1 segment, such that a corrugation pattern of each individual subpanel is substantially maintained across the joined pair of subpanels.

Figure 2E:
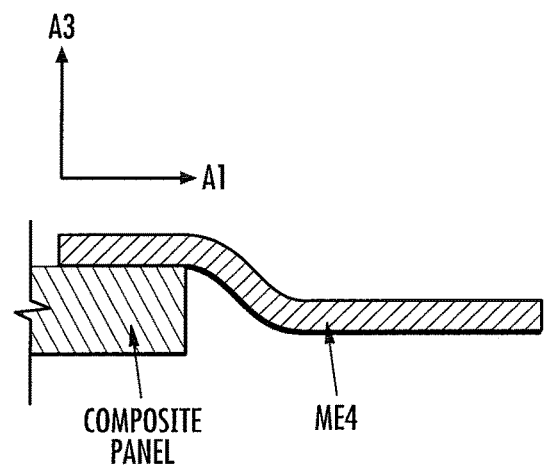
Figure 2F:
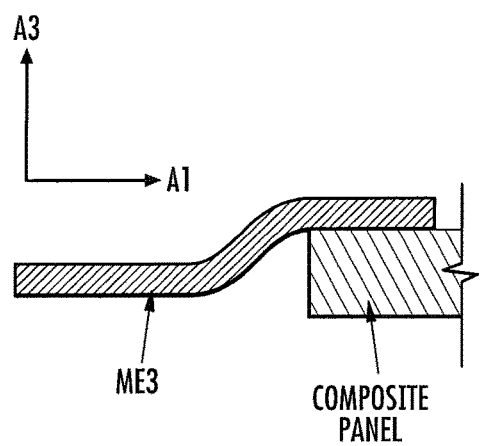
Figure 2G:
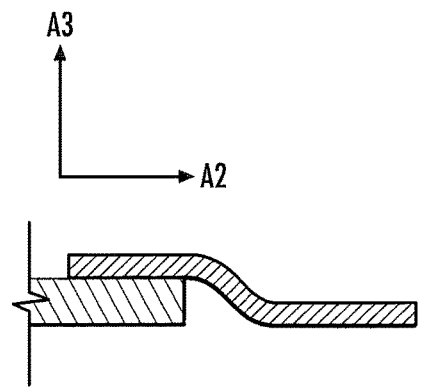

An exemplary side or edge view of edge elements ME3 and ME4 at opposing ends of a composite roof panel are shown in FIG. 2E and FIG. 2F. An exemplary side edge element ME1 or ME2 of the composite roof panel is shown in FIG. 2G.

In a most preferred embodiment, the layered composite material forming panel element 11 has a layer profile $M_2/0_3/90/0/90/0_3/M_2$ wherein subscripts 2 and 3 denote two and three layers respectively, and wherein M denotes a mat fiber layer, 0 denotes a layer with longitudinal fiber orientation parallel to axis A2 and 90 denotes longitudinal fiber orientation perpendicular to the axis A2. In an alternative embodiment, a panel element 11 may have a layered composite material with a profile: $M_2/90/0_3/0/0_{3/90}/M_2$ wherein subscript 3 denotes three layers, and wherein M denotes a mat fiber layer, 0 denotes a layer with longitudinal fiber orientation parallel to axis A1 and 90 denotes longitudinal fiber orientation perpendicular to the axis A2. Also, a panel may have layered composite material with a profile: $M_3/0_3/0/0_3/M_3$ wherein subscript 3 denotes three layers, and wherein M denotes a mat fiber layer, 0 denotes a layer with longitudinal fiber orientation parallel to the axis A2 and 90 denotes longitudinal fiber orientation perpendicular to the axis A2. The above three layer profiles provide robust panel elements and are preferred in terms of strength and weight for conventional sized container applications, but other layer profiles may be used as well. Test results show better flexural and impact strength than conventional steel container walls.

As described above, the composite containers may include panels that have the above-described configuration. However, in some configurations of containers in keeping with the invention, an alternative panel may be used for the principal payload-bearing floor of a container. In such containers, the floor panel may be a hybrid panel fastened to transverse floor joists, composed of an additional material along with a fiber-reinforced polymer composite material, for example, a hybrid panel as described below.

Figure 3:
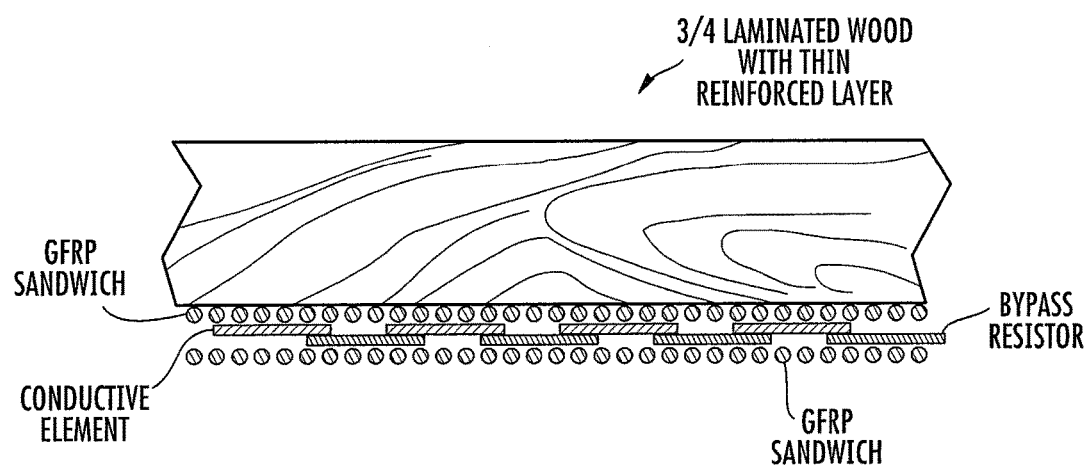
FIG. 3 illustrates a cross-sectional view of a hybrid panel with a wood layer with sensors.

Referring to FIG. 3, a hybrid panel is shown comprising a wood layer and a composite material layer bonded to the bottom side of the wood. The wood layer is preferably ¾ inch laminated plywood including one or more of hard and soft wood, solid-sawn tongue-and-groove hardwood planks, and partially laminated solid-sawn hardwood. The composite material layer is a multilayer fiber/binder structure for example, E-glass/vinylester. As with the panels of FIG. 1, the hybrid panels can include a sensor system embedded within the fiber-reinforced polymer composite layer. The composite component of the hybrid panel provides a host environment for the sensors, protects from the environment, and strengthens the wood in flexure, allowing percent weight reduction over conventional apitong plywood container floors.

Figure 4:
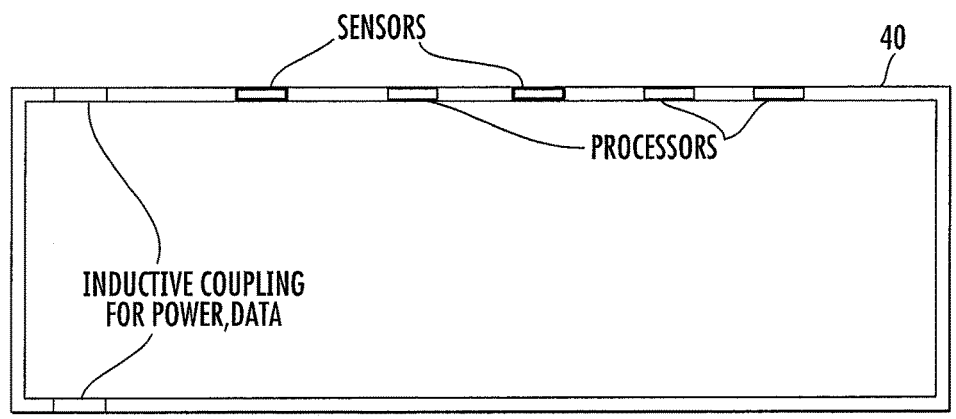
FIG. 4 illustrates a front perspective view of a panel that includes embedded sensors and processors.
Figure 5A:
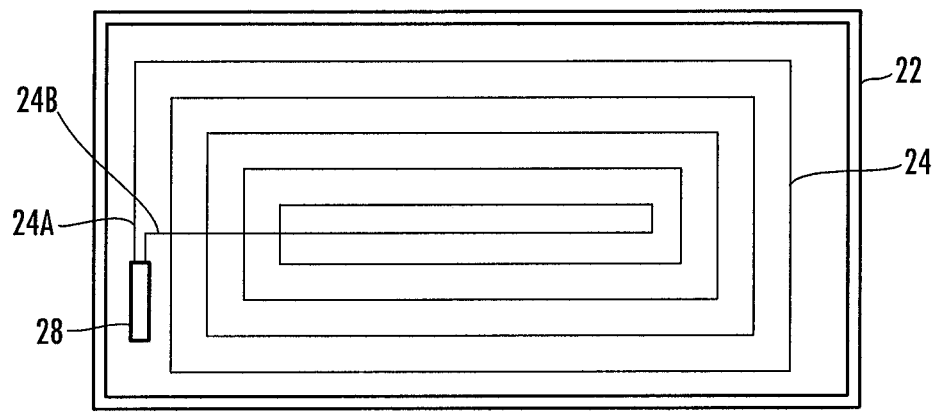
FIG. 5A-5E illustrate front perspective views of a various configurations of a conductive grid within a composite panel.
Figure 5B:
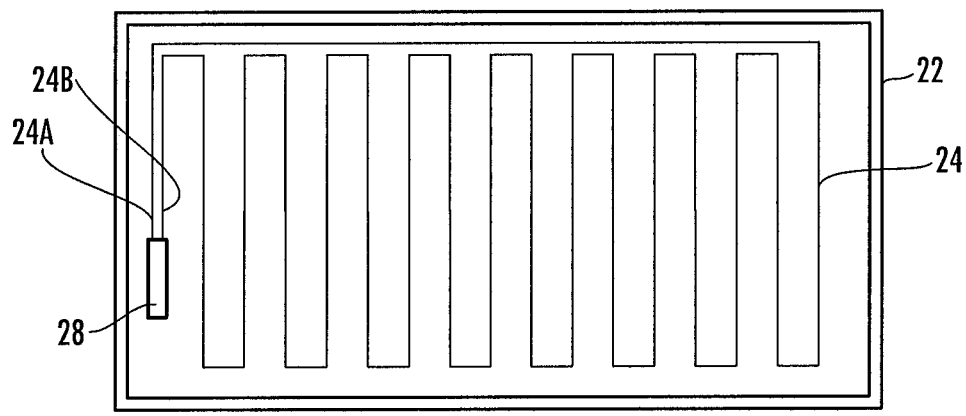
Figure 5C:
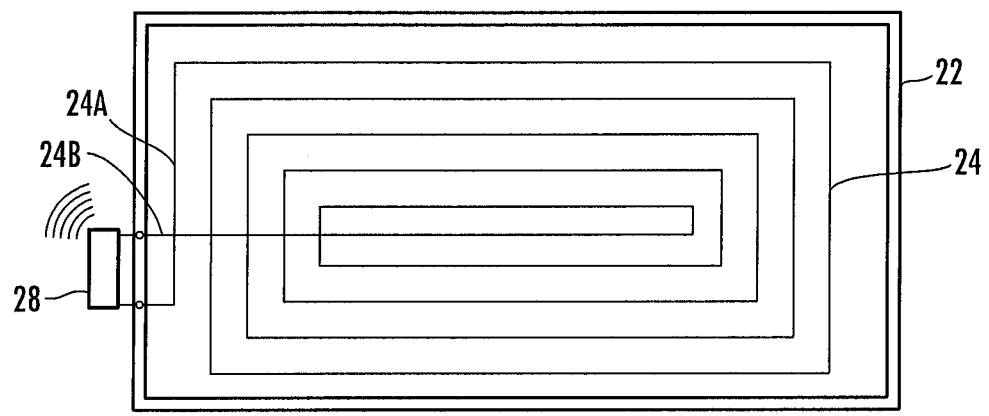
Figure 5D:
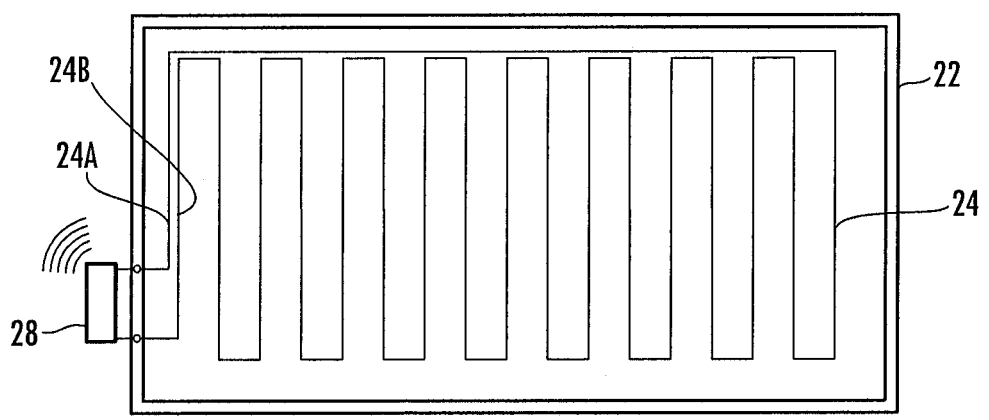

In one embodiment, to meet the primary sensing objectives of breach detection, the panels 40 may include a sensor system embedded therein which can include a series of sensors, processors and data paths, see FIG. 4. In one form, an advantage of embedding sensors, processors, and other devices in a hardened composite material is that the material acts as a protective coating, which protects the devices from the harsh maritime environment and from tampering. This approach is to be contrasted with placing intrusion sensing devices on existing containers, which do not present a protected environment to externally applied intrusion sensing devices. Another advantage of embedding sensors in the container material is that the entire system can be tested in the factory when the container is first constructed. In one embodiment, the sensor system contains a grid of embedded array of optical fibers and optical sensors. The sensor system may be arranged in a number of different forms. In FIG. 5A, a panel 22 is shown having a single fiber 24 in the form of a spiral, extending between opposite ends 24A, 24B. An internal optical signal generator/detector 28 is coupled to ends 24A, 24B. The generator/detector 28 is adapted to apply an optical signal to end 24A so that the signal propagates along fiber 24 to end 24B where, provided the fiber 24 is intact, that signal is detected by generator/detector 28. In the event of a breach of the panel 22, the optical fiber 24 would be interrupted so that an applied optical signal would not reach to end 24B. The generator/detector 28 is adapted for remotely controlled operation (actuation and detection). While the generator/detector 28 in FIG. 5A is internal to (embedded in) panel 22, in other embodiments the generator detector is external to the panel 22. In such embodiments, the generator/detector 28 is adapted for remotely controlled operation. FIGS. 5B and 5C illustrate two other configurations of fiber array. In FIG. 5B, a serpentine arrangement is shown where elements similar to elements in FIG. 5A are identified with the same reference designation. Again, in FIG. 5B, the generator/detector 28 is embedded in panel 22. FIGS. 5C and 5D illustrate embodiments similar to those in FIGS. 5A and 5B, but where the optical signal generator/detector 28 is external to panel 22.

Figure 5E:
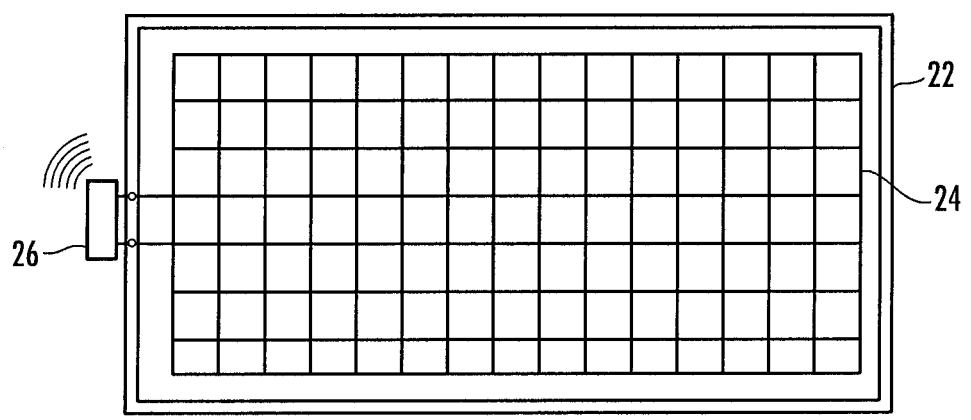

In another arrangement, a panel may include a plurality of optical fibers, each having a first end at an input port in the panel, and extending through panel to a second end at an output port in the panel. An optical driver having a light source is connected to the optical fibers at the input port. Upon receiving a start or activating a signal (coded or uncoded), the driver causes radiation to propagate into the optical fiber at its first end at the input port. An optical detector is coupled to the output port to detect light propagating along the fiber from the input port. The two ends of optical fibers, in some forms, are coupled to switches to permit selective input of light and detecting of light. The switches permit fibers to be pulsed under program control and allow a grid of fibers orthogonally extending in the container walls. The x axis and y axis fibers are pulsed or actuated selectively under program control, so that the integrity of the various fibers is maintained in a manner permitting detecting of fiber breaks or degradation and locating those breaks based on x and y coordinating grid with this configuration. If an intrusion interrupts or stresses an optical fiber embedded in the composite material of the panels, the use of x and y axes of fibers locates the intrusion. In some arrangements, processors are embedded in the composite material and are electrically connected to the optical drivers. Many optical drivers may be utilized in a container constructed of the composite material. FIG. 5E illustrates a multi-fiber sensor array but without showing the optical signal generators, detectors or switches.

In another form of the invention, the sensor system includes an array of electrical conductors. The array of electrical conductors includes at least one electrical conductor extending between two ends thereof and arranged in multiple configurations. The electrical conductor array can have the same configuration at the optical fiber arrays in FIGS. 5, 5A-5E, and thus are illustrated in those figures. In one embodiment, the serpentine configuration includes at least one resistive bypass path (FIG. 7A) interconnecting between two points along said serpentine configuration. One of said points is adapted to receive an electrical signal. The sensor system includes an electrical signal generator coupled to one end for generating an electrical signal and an electrical signal detector coupled to the other end for detecting the electrical signal. The electrical signal generator can be adapted for remote activation. Also, the detector can be adapted for remote activation. Both the electrical signal generator and the detector can be embedded in the panel or external to the panel.

The processor and sensor type and the density of the processors and sensors in the container walls can be customized to meet a user's needs. Furthermore, in some designs, electrical paths and data paths and various data processing elements such as Complex Programmable Logic Devices (CPLDs) and/or Field Programmable Gate Arrays (FPGAs) or similar elements may be incorporated to provide control and communication functionality. Additionally, to provide energy for these and similar sensors and elements, a power source such as a battery or rechargeable battery may also be embedded in the composite materials. The batteries for powering the sensors and the processors and the light sources are preferably rechargeable batteries, which can be periodically charged. The system is preferably provided with plenty of bandwidth and redundant processing power to fulfill the alerting, data acquisition, and communication requirements of a user.

Figure 6:
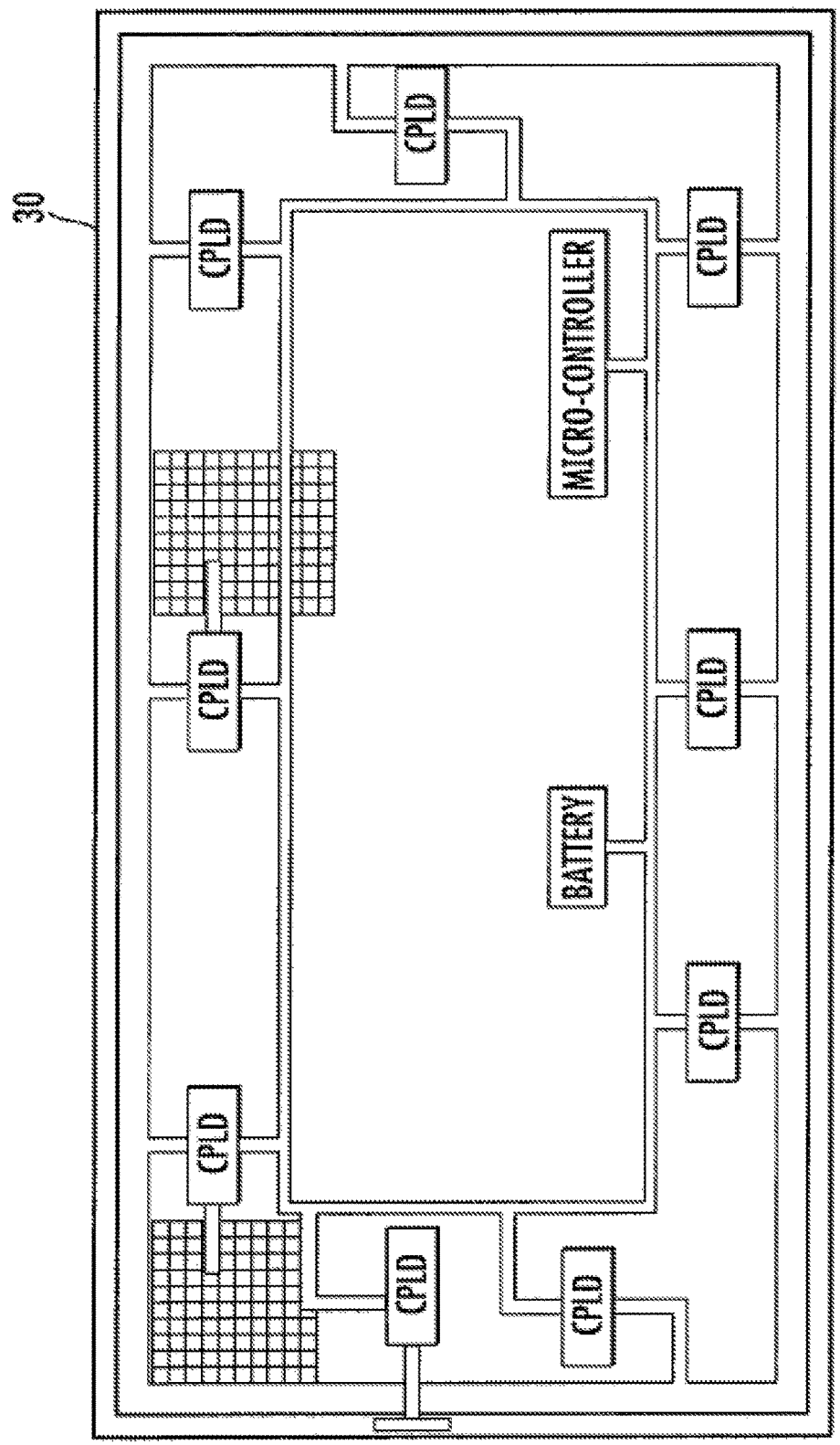
FIG. 6 illustrates a front perspective view of a panel that includes embedded components and buses.

Referring to FIG. 6, in another embodiment, a panel includes one or more processors embedded into the composite material. The processors are powered by a battery connected to the processors. These processors are distributed throughout the composite material in locations that are less likely to be damaged during use. The processors can respond to sudden events and "wake up" in response to alarms to preserve the battery. The wake up may be the result of an intrusion or as the result of receipt of an externally applied RF signal. In some embodiments, to reduce power consumption, the processors wake up on a regular basis. For example, the processor can periodically wake up and provide status, saying "here is my ID, I'm okay."

The processors have the ability to store data in flash memory and erase data from flash memory. Consequently, they may be utilized to provide a coded unchanging ID, which is a number uniquely identifies a particular composite panel, and a certificate, which is a number given after a panel has been inspected, to a composite panel. In one embodiment, a network of processors is coupled together in a substrate grid. The networked processors manage the detection grids and provide IDs and certificates. Upon detection of an intrusion of the panel, the processor may completely destroy the value of the IDs and certificates to prevent spoofing of the panels.

Figure 7A:
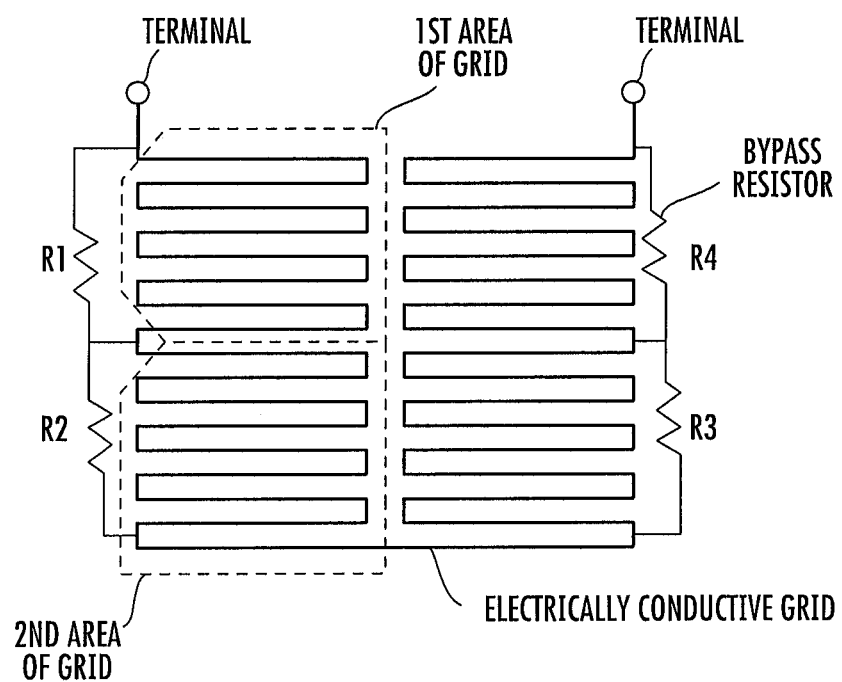
FIG. 7A illustrates a schematic diagram of a sensing circuit including bypass resistors.

Referring to FIG. 7A, in one form of the invention, the panel contains a sensor system that includes a sensing circuit having an electrically conductive path with multiple bypass resistors R1, R2, R3, R4 (generally R). The electrically conductive path includes an array of electrically conductive elements arranged in a circuit, such as a grid, spanning an area of the panel. If the grid is intact, a substantial portion of the electrical current flows through the electrically conductive elements rather than through the bypass resistors R. Consequently, a resulting circuit resistance measured at a pair of circuit terminals indicates a short circuit with a measurable resistance being that of the electrically conductive paths themselves. When the conductive path is broken, at least a portion of the current is then diverted through one or more of the bypass resistors R. The resultant change in resistance is then detectable by a resistance-monitoring circuit.

In some embodiments, the circuit is planar, spanning a substantial area of the panel. In the exemplary embodiment of FIG. 7A, the array of electrical conductive elements are arranged in a series configuration extending between a pair of sensing terminals. The array of electrically conductive elements can be arranged, as shown, to include a serpentine pattern. A first bypass resistor R1 is coupled between two points along the conductive path, such that a portion of the conductive path between the two coupled points covers a first area of the panel. Similarly, the remaining bypass resistors R2, R3, R4 are each respectively coupled between two different points along the same conductive path.

In the exemplary embodiment, a break in the panel interrupts the conductive path and results in current being diverted through the respective bypass resistor R. Thus, a break in the first area of the grid will result in current flowing through the first bypass resistor R1. A resulting resistance measured at the circuit terminals will change from a short circuit to approximate the value of R1. As multiple areas of the same grid are broken, the current will be diverted through one or more additional bypass resistors R. The resulting circuit produces a voltage drop that depends upon the combination of bypass resistors through which the current is flowing. Should one or more breaks interrupt conductive paths in other areas of the exemplary series-configured sensing circuit, voltage drop at the terminals will be the sum of the voltage drops across all of the bypass resistors through which current is flowing. In some embodiments, one or more of the bypass resistors provide different resistive values that can be used to identify locations of one or more areas of the panel that are breached.

Figure 7B:
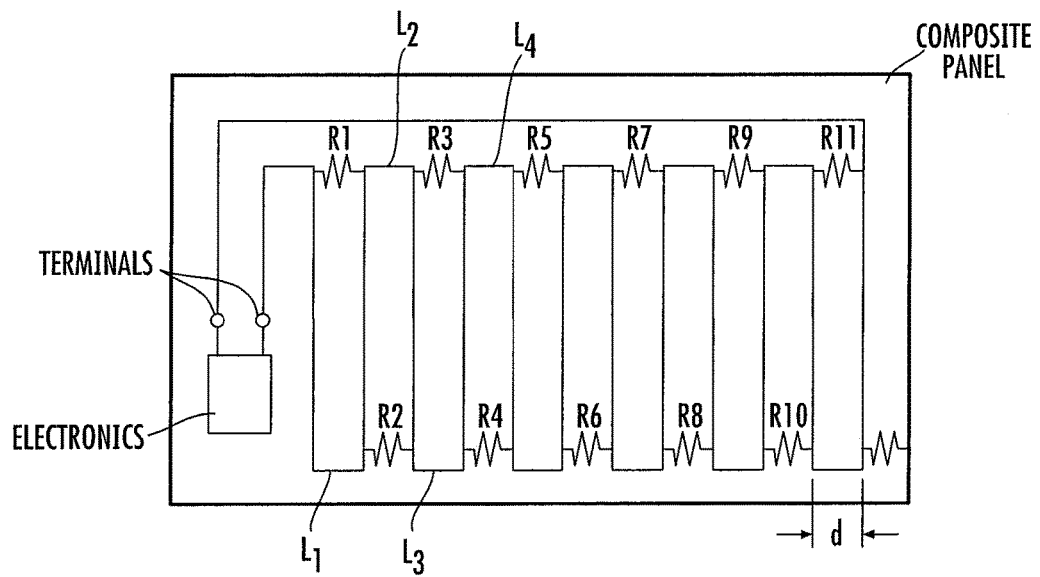
FIG. 7B illustrates a schematic diagram of one embodiment of a panel with an embedded circuit including sensors and bypass resistors.

An exemplary embodiment of a panel sensing circuit including bypass resistors is shown in FIG. 7B. The sensing circuit includes a serpentine conductive path spanning a substantial region of a composite panel. The serpentine path includes multiple U-shaped circuit legs $L_1$, $L_2$, $L_3$ . . . (generally L) coupled together in a series configuration. Each of the circuit legs L is connected in a parallel or shunt configuration to a respective bypass resistor R1, R2, R3 . . . (generally R). The series circuit formed by the serpentine conductive path and bypass resistors R also includes a pair of terminals. A break in any one of the circuit legs L will result in a diversion of electrical current from the leg and through the bypass resistor R.

Figure 7C:
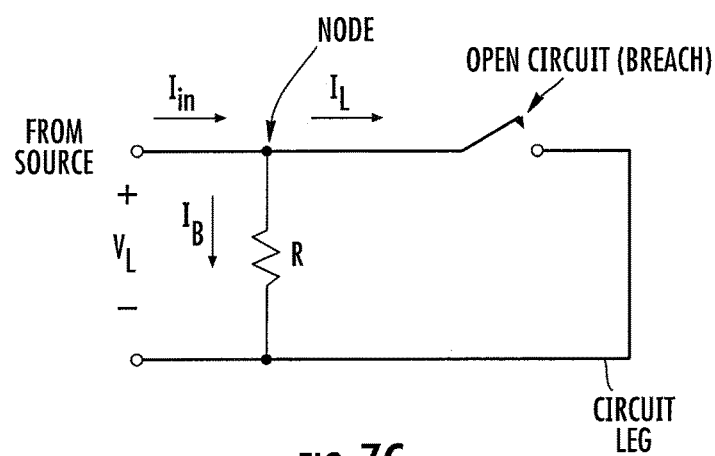
FIG. 7C illustrates a more detailed schematic diagram of one leg of the embedded circuit of FIG. 7B.

A schematic diagram of one of the legs L and its interconnected shunt resistor R is shown in more detail in FIG. 7C. An input current in enters a first node. According to well-established circuit principles, the input current is equivalent to the sum of the currents exiting the node including a bypass current $I_B$ flowing through the bypass resistor and the leg current $I_L$ flowing through the circuit leg L. In a non-breached configuration, the majority of current flows through the circuit leg, such that $I_L=I_{in}$, producing a negligible voltage drop $V_L$ due to resistance of the electrical conductor. However, if the circuit is breached, the current flows through the bypass resistor, such that $I_R=I_{in}$. Consequently, the voltage drop increases according to the value of the bypass resistor ($V=I_{in}/R$). If more than one circuit legs are breached, the measured circuit resistance will vary in relation to the resulting circuit configuration.

In some embodiments, the sensing circuit is embedded within an insulating material forming the panel. Alternatively or in addition, at least a portion of the sensing circuit can be attached to a surface of the insulating material of the panel. Such insulating material can include resin-infused layers of fiber material, such as any of the composite materials described herein. In some embodiments, the panel includes a second insulating material, such as wood.

In some embodiments, the circuit terminals are connected to external electronics for determining the resistance of the circuit. In other embodiments, the circuit includes electronics coupled to the pair of terminals for determining the resistance of the circuit. The electronics can include a signal generator providing an electrical current to the sensing circuit. Alternatively or in addition, the electronics can include a detector for measuring a voltage across the pair of terminals. In some embodiments, the electronics includes a controller for determining a resistance based on the generated current and detected voltage.

One such controller is the 16F684 microcontroller, commercially available from Microchip Technology, Inc. of Chandler, Ariz. The controller promotes low power consumption, requiring approximately 100 microamperes during a reading. The readings can be accomplished in much less than 1 millisecond. In some embodiments, readings are performed at a rate of one per second. The average current is virtually zero.

Alternatively or in addition, the electronics includes a radio transmitter configured to temporarily operate in a low-power "sleep" mode to conserve power. The transmitter can be used to forward reading results from the microcontroller to an external receiver. The electronics optionally include a radio transmitter also configured to temporarily operate in a low-power "sleep" mode. The entire electronics package can be powered using two D-cell batteries, with an expected battery lifetime of about five years or more.

In some embodiments, one or more of the panels are connected to at least one other panel of the same container using jumper leads. For example, one panel including an embedded sensor system and controlling electronics can be electrically connected to another panel through one or more jumper leads. Thus, in some embodiments, electronics in one panel can be used to perform measurements on more than one panel.

Figure 7D:
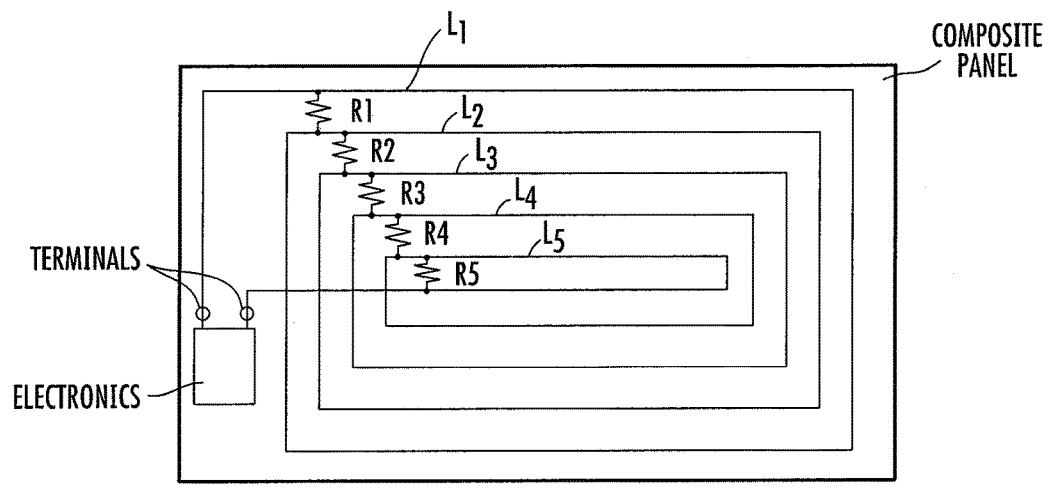
FIGS. 7D-7E illustrate schematic diagrams of various embodiments of a panel each having a different configuration of an embedded circuit including sensors and bypass resistors.

FIG. 7D illustrates another embodiment of a composite panel providing a sensing circuit having a different configuration including multiple interconnected loops $L_1, L_2, L_3$ . . . (generally L). More specifically, the loops are arranged in a spiral configuration terminating at a pair of circuit terminals. Each loop L extends around the spiral and is interconnected to an adjacent loop by a respective bypass resistor $R_1, R_2, R_3$ . . . (generally R). Without interruption to the conducting path of the circuit, the majority of current flows through the spiral element, such that a resistance detected at the terminals approximates a short circuit. Interruption of one or more of the loops L; however, results in the loop current flowing through one or more bypass resistors R associated with the interrupted loop(s). Consequently, a circuit resistance measured at the terminals increases from the short-circuit value, depending upon the values of the one or more bypass resistors now carrying current.

The delectability of various sized and shaped panel breaches, or holes, can be controlled to some extent according to a selected configuration, orientation, and spacing of electrically conductive path of the sensing circuit. Referring again to FIG. 7B, a panel breach having a diameter less than the spacing 'd' between adjacent circuit legs may be detected if a portion of the hole coincides with the electrical conductor. However, it would not be possible for such a hole to remain undetected as long as it did not interrupt the electrically conductive path. A panel breach in the form of an elongated hole or slit having a length greater than 'd' may remain undetected if properly aligned between conductive paths.

Figure 7E:
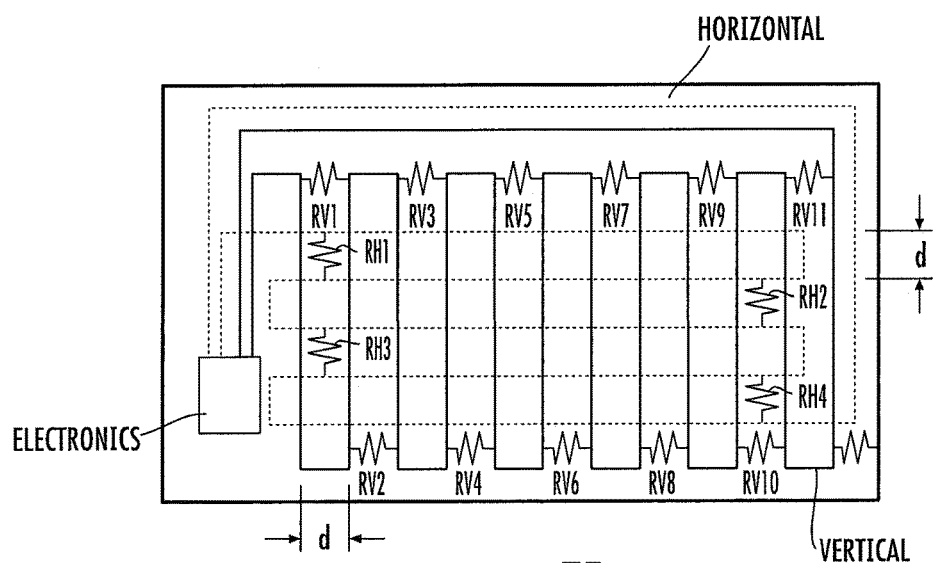

FIG. 7E illustrates an embodiment of a composite panel with yet another different sensing circuit configuration including a horizontally directed serpentine pattern overlaying a vertically directed serpentine pattern. Such a configuration forms a rectangular grid capable of sensing a breach of the panel in more than one direction. Thus, although an elongated breach having a length greater than 'd' may be undetected by one of the two different patterns, it will be detected by the other. In some embodiments, the two patterns are provided between different layers of the resin-infused layers of fiber material providing electrical insulation between the two different patterns.

It would also be possible for a breach or hole having a diameter substantially less than the spacing 'd' to be detected if it happened to coincide with the conductive path, thereby interrupting the flow of current. Consequently, there is no assurance of a minimum-sized detected hole.

Figure 8:
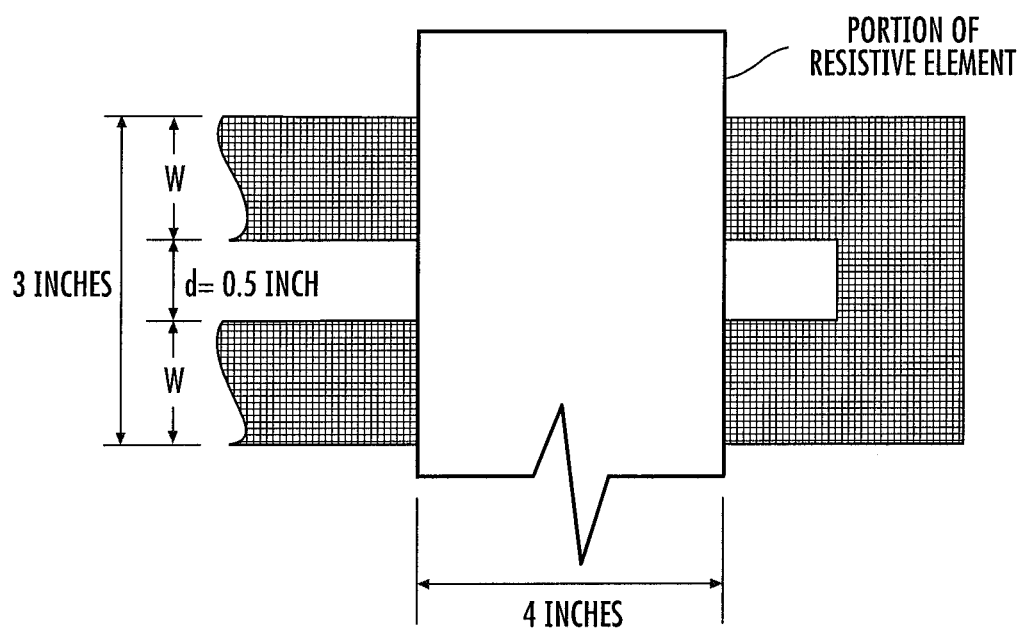
FIG. 8 illustrates a plan view of one embodiment of a circuit element using a wide conductor.

Referring to FIG. 8, an alternative embodiment of a sensing circuit includes an electrically conductive path in which the electrical conductors are formed to have a wide, ribbon-like configuration. As shown, the electrically conductive path is formed using a conductor having a width 'w'. It would be impossible for any panel breach, or hole, having a maximum dimension less than the conductor width 'w' to completely interrupt current flow along any one of the conductive paths. Thus, selection of a conductor width 'w' can be used to eliminate detection of individual holes of sizes less than the conductor width size. In the illustrative example, a conductor having a width of 1.25 inches prevents detection of any holes less than 1.25 inches in diameter.

The distance between adjacent legs of the sensing circuit can also be used in combination with the conductor diameter to set a limit for which a minimum detectable hole size will always be detected. Namely, a hole sized greater than twice the width plus the separation distance "d" between adjacent conductors (i.e., 2w+d) will always interrupt at least one of the conductors. In the exemplary embodiment, a 3 inch hole will always interrupt at least one of the two 1.25 inch wide conductors separated from each other by 0.5 inches.

The wide conductors can be porous, including openings distributed across the width of the conductor. In some embodiments, the wide conductors are formed from a wire mesh or screen. When used in combination with composite panels, the wide conductors can reside substantially within the composite panel (e.g., between resin-infused layers of fiber material). That configuration is particularly amenable to use in a composite material, as the resin binder can readily permeate the conductive element minimizing any tendency for delamination of a composite panel.

Sensing circuits including wide electrical conductors can also be routed in a variety of configurations and optionally combined with bypass resistors. In some embodiments, the bypass resistors are themselves provided to have a substantial width. Wide bypass resistors reduce the possibility that a panel breach having a hole below the minimum detectable hole size will cause an interruption because it happened to coincide with a narrow bypass resistor. As shown, a bypass resistor having a width of 4 inches can be combined with the exemplary circuit adapted to consistently detect holes equal to or greater than 3 inches, without detecting holes less than 1.25 inches in diameter. Wide bypass resistors can also be provided with an open structure including pores or apertures.

Figure 9:
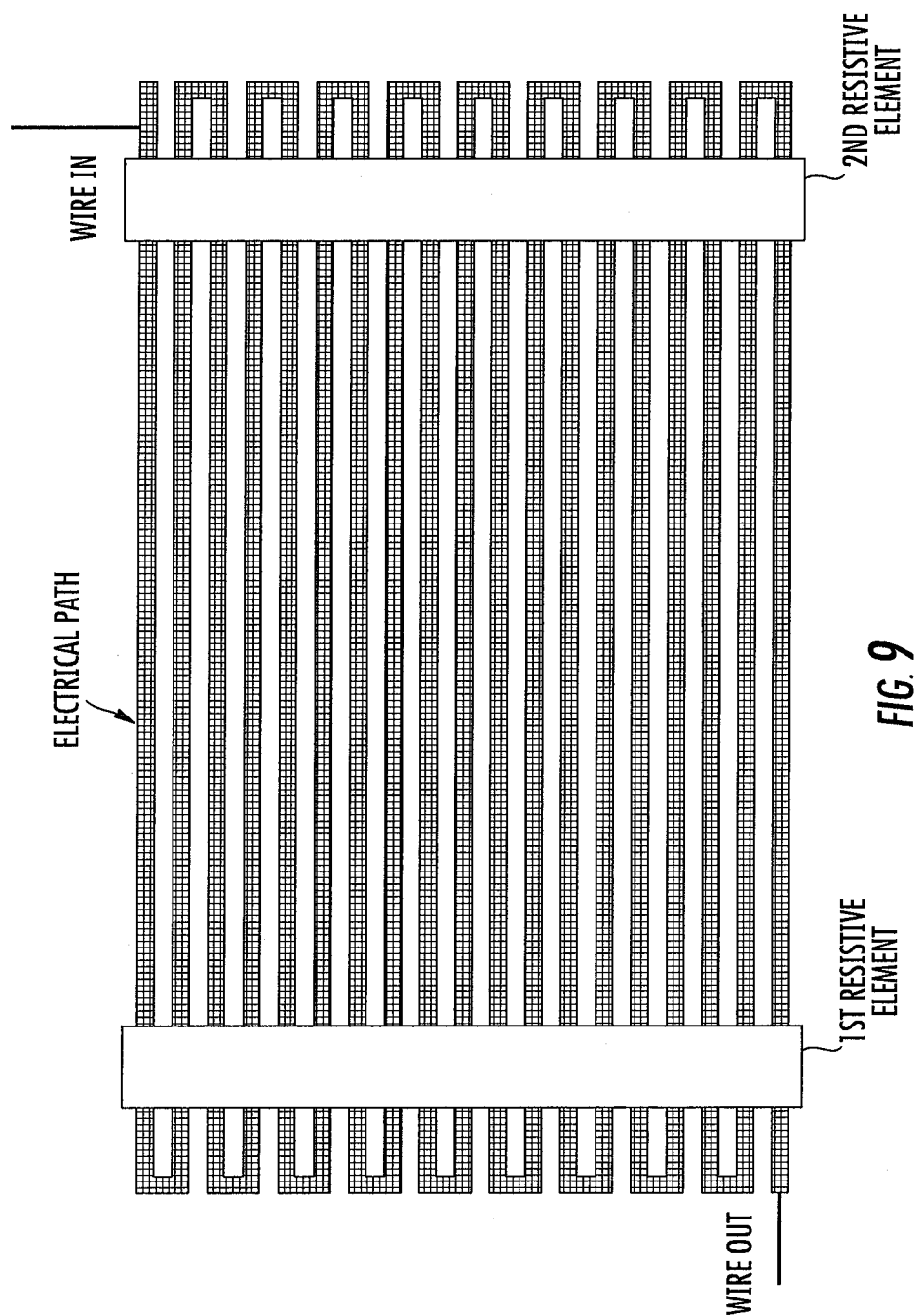
FIG. 9 illustrates a plan view of another embodiment of a panel with an embedded circuit including wide-conductor sensors and bypass resistors.
Figure 10A:
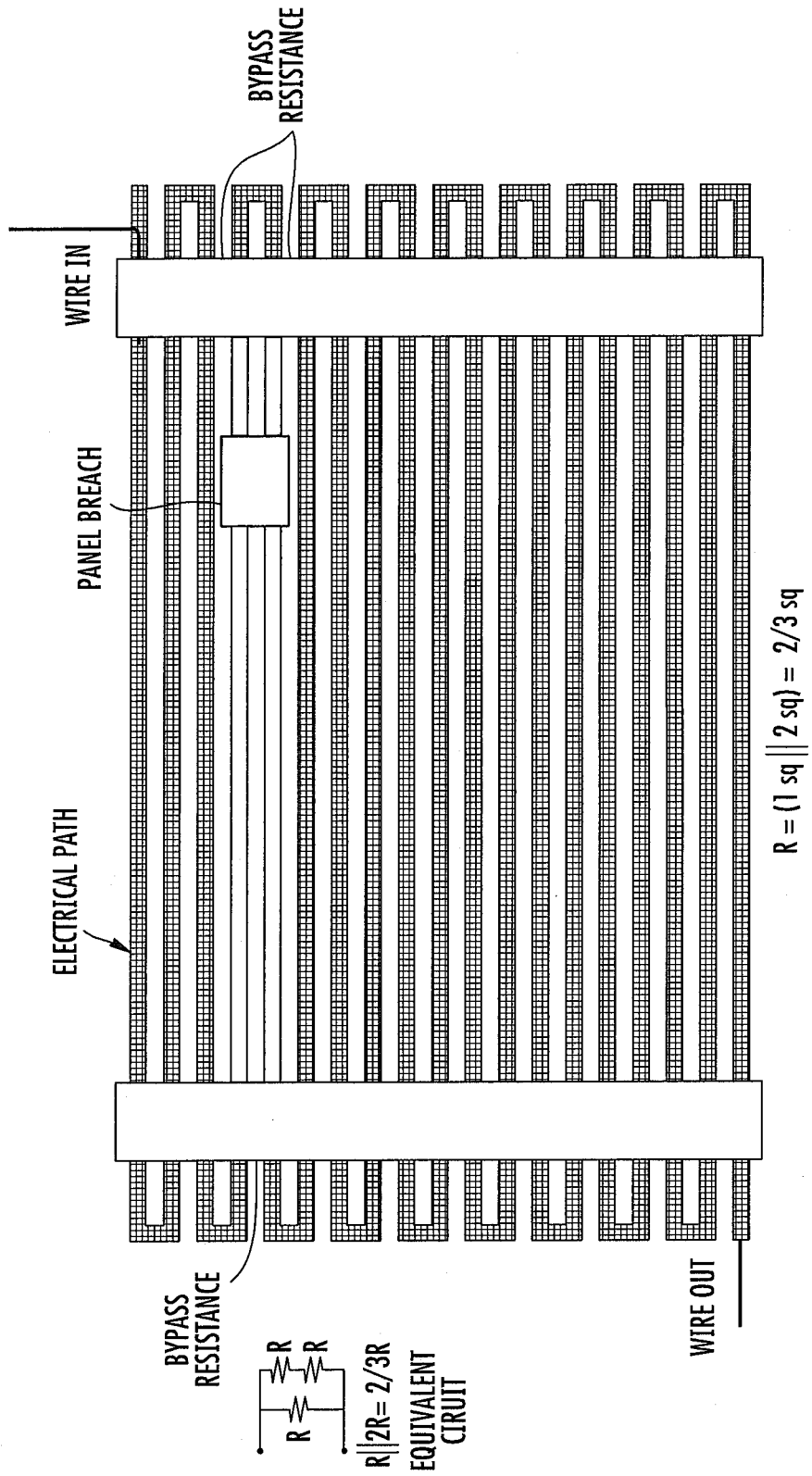
FIGS. 10A-10C illustrate the front panel embodiment of FIG. 9 with holes of various sizes and locations.
Figure 10B:
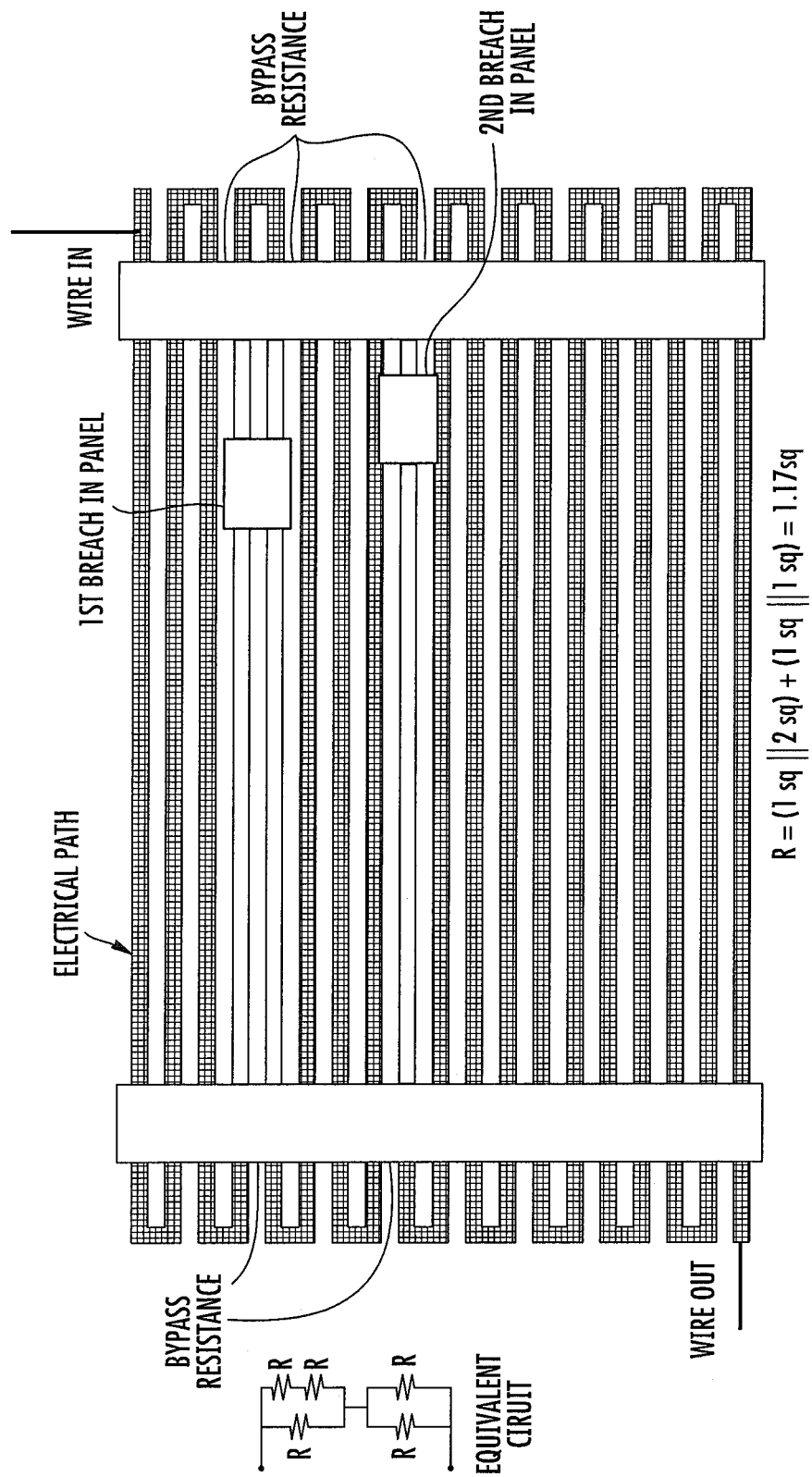

FIG. 9 illustrates an unbroken electrical path having a serpentine configuration and using an electrically conductive screen providing a wide conductor. Two resistive elements are included towards either edge of the serpentine configuration and selectively coupled to one or more of the multiple serpentine circuit legs. In FIG. 10A, a panel breach interrupts two legs of the serpentine circuit. A resulting interruption to current flowing in the effected legs, now open circuited, causes current to flow through the identified bypass resistors. The resulting circuit configuration can be schematically represented as a first resistor shunting a series combination of two other resistors. If all of the resistors are provided with the same resistance R, the effective resistance of the resulting circuit would be ⅔ R. The same circuit is again shown in FIG. 10B with a second smaller hole. The resulting circuit configuration can be schematically represented as the equivalent circuit of FIG. 10A combined in series with a parallel combination of two additional bypass resistors that are associated with the second hole. The effective resistance is 1.17 R.

Figure 10C:
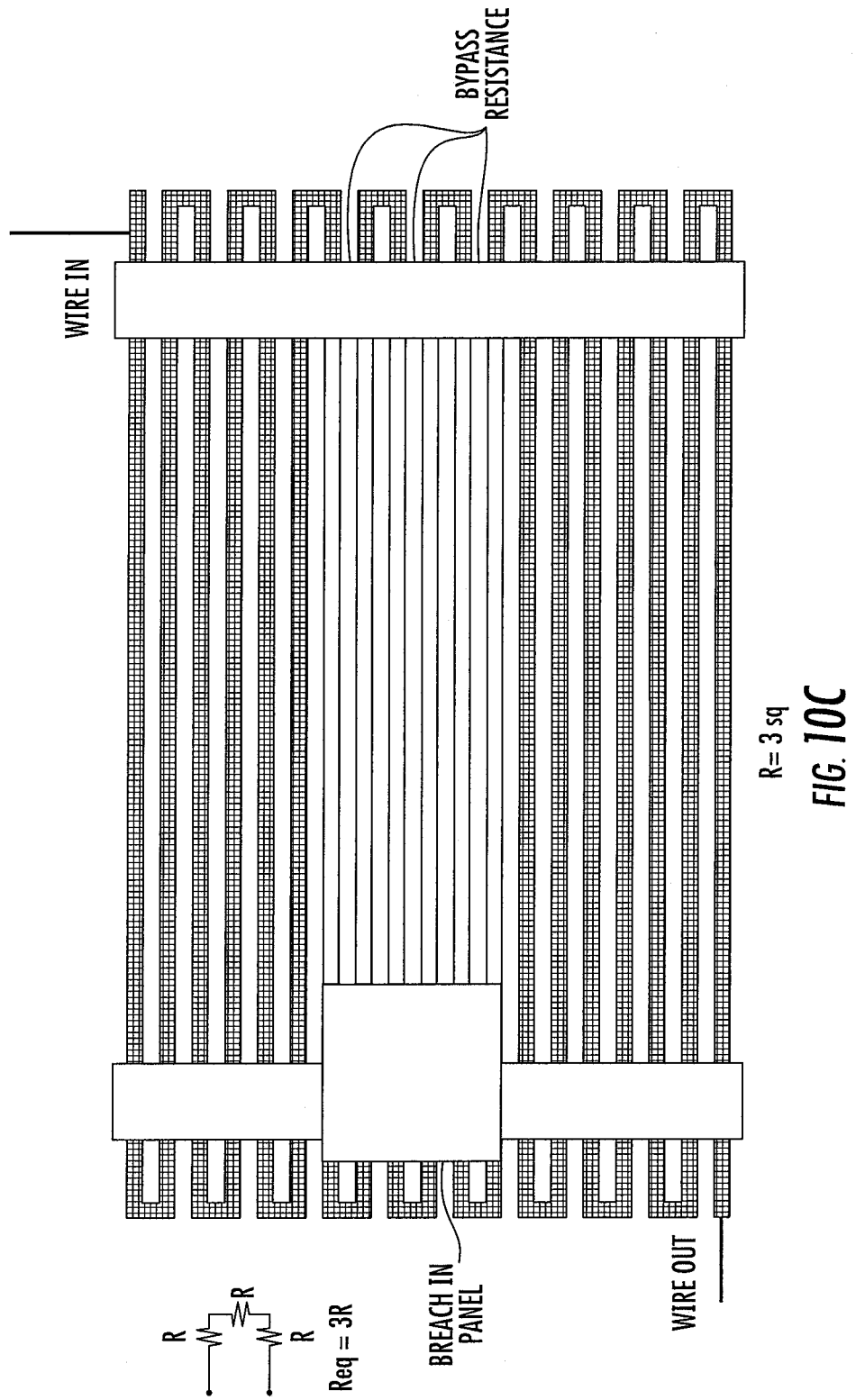

FIG. 10C illustrates the same circuit as in the above examples having a large hole coincident with one of the resistive elements. Current flows in the resulting circuit through three of the bypass resistors on the opposite side of the panel from the hole, resulting in an effective resistance of 3 R. As demonstrated, holes of various size, combination, and location will generally produce different circuit resistance values. This allows for an association of a measured resistance to a hole of a particular size and/or location.

Each conductive element in any of the above embodiments has a respective impedance that is substantially less than a bypass resistor R. For example, the conductive elements are formed from a material generally known as a good electrical conductor. Examples of good electrical conductors include metals, such as copper, aluminum, gold, silver, and nickel; metal alloys, such as bronze; and combinations thereof.

Bypass resistors can include standard carbon-based resistor configurations, such as carbon composition, film, and wire wound resistors, and combinations thereof. In some embodiments, the bypass resistors can include a carbon-based material having a flat or ribbon-like geometry.

Figure 11:
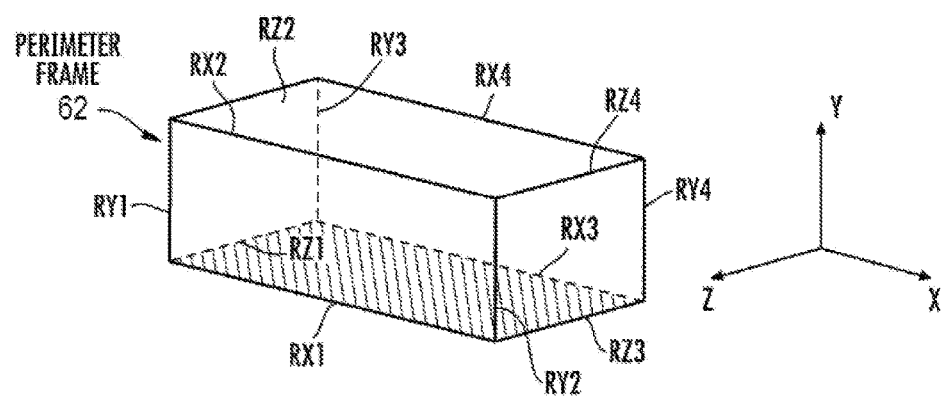
FIG. 11 illustrates a front right perspective view of a container.

The panel of FIG. 1 may be used to form a container 60. In one form, six panels are affixed to a frame 62 such as that shown in FIG. 11. The frame 62 is a rectangular parallelepiped frame composed of a weldable metal, and having four equal length parallel rails RX1, RX2, RX3, and RX4 extending along an X axis. Another set of four equal length parallel rails RY1, RY2, RY3, and RY4 extends along a Y axis. Also, four equal length parallel rails RZ1, RZ2, RZ3 and RZ4 extend along a Z axis, wherein said X, Y, and Z axis are mutually orthogonal. The rails RX1, RX2, RY1, and RY2 define a first side panel locus. The rails wherein RX3, RX4, RY3, and RY4 define a second side panel locus. The rails RY1, RY3, RZ1, and RZ2 define a first end panel locus. The rails RY2, RY4, RZ3, and RZ4 define a second end panel locus. The rails RX2, RX4, RZ2, and RZ4 define a top panel locus. The rails RX1, RX3, RZ1, and RZ3 define a bottom panel locus.

Figure 13:
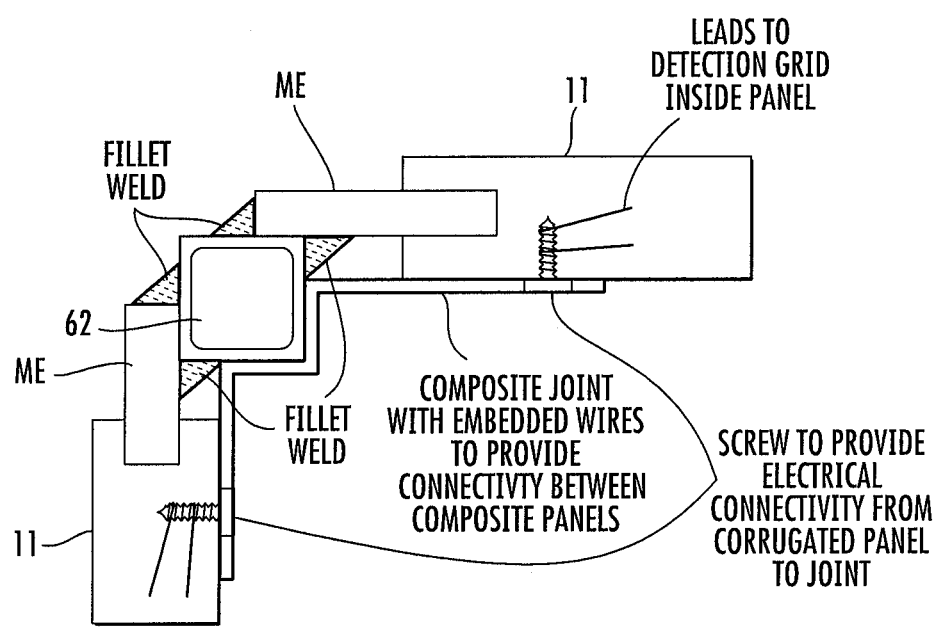
FIG. 13 illustrates a detailed top view of two panels welded to the frame of a container.
Figure 14B:
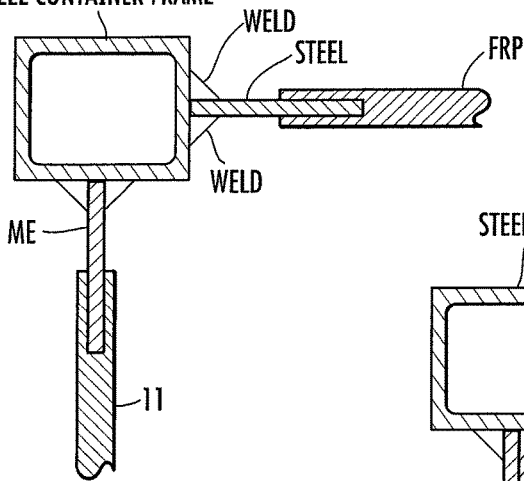
FIG. 14B illustrates a detailed top, cross-sectional view of two panels shown in FIG. 2C welded to the frame of a container.
Figure 14C:
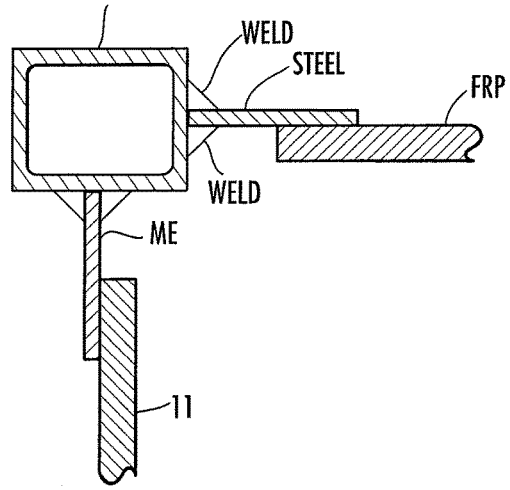
FIG. 14C illustrates a detailed top, cross-sectional view of two panels shown in FIG. 2A welded to the frame of a container.
Figure 14A:
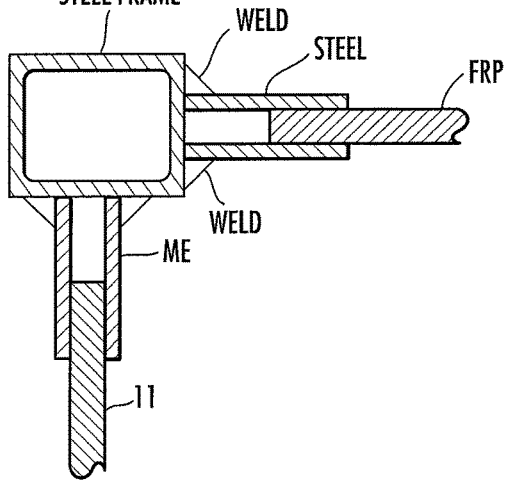
FIG. 14A illustrates a detailed top, cross-sectional view of two panels shown in FIG. 2B welded to the frame of a container.

To construct a container 60 on frame 62, panels of the type shown in FIG. 1 are sized to fit the corresponding loci defined by the frame rails, and welded to those rails of frame 62. For example, a first panel 80 is disposed in the first side panel locus, and welded at its peripheral edge elements ME to said rails RX1, RX2, RY1, and RY2. FIG. 13 illustrates an exemplary welding joint formed between edge element ME and frame 62. That weld extends between the weldable metal that extends from the panels element of the panel. Similarly, a weldable panel is disposed in the second side panel locus and welded at its peripheral edge elements ME to rails RX3, RX4, RY3, and RY4. Another weldable panel is disposed in said first end panel locus and welded at its peripheral edge elements ME to rails RY1, RY3, RZ1, and RZ2. Another weldable panel is disposed in the top panel locus and welded at its peripheral edge elements ME to rails RX1, RX4, RZ2, and RZ4. The container may further include another weldable panel disposed in the bottom panel locus and welded at its peripheral edge elements ME to rails RX1, RX3, RZ1, and RZ3. Alternatively, hybrid reinforced wood panels may be fastened to the floor joists using conventional mechanical fasteners used in existing construction of floors. A container further includes a weldable panel disposed in second end panel locus and welded at its peripheral edge elements ME to rails RY2, RY4, RZ3, and RZ4. Any one or more, of the panels can alternatively be hingedly coupled to the frame to form a door for the container. Exemplary welding joints between the panels of FIG. 2B and a steel frame are shown in FIG. 14A; between the panels of FIG. 2C and the steel frame are shown in FIG. 14B; and between the panels of FIG. 2A and the steel frame are shown in FIG. 14C.

In one arrangement, a composite container is constructed to have a shape and size similar to a standard steel shipping container so that the composite container can be used interchangeably with conventional steel shipping containers. In this case, the perimeter frame is made of typical steel members used on conventional ISO steel shipping containers. Composite containers of the invention may be stacked and loaded similar to conventional steel containers, using conventional loading equipment.

In some embodiments, two or more weldable sub-panels can be combined, such that the combination is sized to fit the corresponding loci defined by the frame rails. As shown in FIG. 12, multiple weldable sub panels are combined along a common side panel of a standard shipping container. The use of sub panels can simplify sparing, as spared components can be smaller in size. Alternatively or in addition, the use of sub panels can reduce maintenance costs as damage can be corrected using smaller panel segments.

A groove and flange design may be incorporated in the container panels to provide electrical power and data paths which will interconnect stack containers, allowing communications amongst and between the containers, and in some cases, establishing a network. Alternatively or in addition, a jumper can be used to interconnect embedded conductors of different composite panels. An exemplary embodiment is shown in FIG. 12A including a jumper provided between adjacent subpanels. The two subpanels are joined with a fillet weld along adjoining metal flanges providing a panel-to-panel connection. A jumper is used to span the joint. The jumper is connected at either end to a respective embedded conductor within each of the adjoining subpanels. In some embodiments, screw terminals are provided on the subpanel providing access to the embedded conductors. Thus, a conductive jumper interconnects the embedded conductors by simply connecting to the exposed screw terminals of a pair of adjacent subpanels.

In some embodiments, a composite joint is formed along respective edges of two adjoining subpanels. The composite joint includes embedded wires that can be used to provide connectivity between the adjacent panels. A conductive element, such as the jumper can span the composite joint, and can be screwed into each of the adjacent subpanels, thereby providing a connection from the panel to the joint.

A single assembled container may be positioned and connected to a container rack. In some arrangements the rack may be connected to a PC or other similar digital device that is capable of accessing the Internet. Along with supplying Internet access, the rack may also supply power to the container (along with other containers). By connecting the container (or containers) to the rack, signals and/or messages that represent a container condition (e.g., the status of the container) may be sent to a remote computer system or server.

Along with sending information to remote locations, components may be embedded in the panels of a container for storing the information for later retrieval. Furthermore, information may be uploaded to the assembled container under control of a remote server. As mentioned above, individual CPLDs may be embedded in panels, and these CPLDs may be used to inexpensively implement relatively high data rates with interfaces implementing one or multiple protocols.

The sensor arrays in the panels of the invention are configured so that a hole on any of the six faces of the container larger than a predetermined detectable size, for example, 9 square inches, can be detected immediately when the hole is cut under circumstances of light or darkness and under any loading condition. Also, conductive serpentine grid bonds with widths of at least about 18 inches prevent false positives so that holes of sizes less than 9 inches do not alarm the system.

In an alternative form, the container wall contains plugs through which processors and other sensors can be coupled, thereby providing a completely modular approach that can be upgraded as new technology becomes available. The processor or processors, using modular standard interfaces manage the sensors, alerting, external communications, and security functions.

In one arrangement, the container system is provided with a security system designed on the assumption that the container may be in the physical possession of criminals or terrorists or other persons with hostile intent. This level of security substantially exceeds security based on the assumption that outsiders are attacking a safe interior core. In one example) the security system includes software, cryptographic tokens, and other types of data that may be securely provided from a remote monitoring station.

Composite container may include other sensors for detecting the opening of one or more doors, movement, extreme environmental conditions, seal status, and other conditions that may be of interest to a customer. In one arrangement, the sensors are embedded in the panels. Alternatively, the sensors may be attached to or plugged into the panels and may be removed from the walls. The composite containers also can be provided with RFID tags and/or RFID monitoring devices or other similar systems.

The sensors and processors in composite container may be further capable of detecting a breach of any of the six walls of the container under any load conditions. The anti-breach system can be tuned to a point where the rate of false positives is acceptably low by using wide bypass resistors and wide conductive grid bands. Embedding the sensors and processors in the container walls also protects the sensors and processors both from sabotage and from the harsh maritime environment when the containers are in use. In one arrangement, the composite container walls are provided with a modular design with attaching means, for example, holes, so that additional equipment (e.g., sensors and or processors) can be rapidly and easily attached to or plugged into the walls, to account for the development of new technologies and/or to configure the container for a specific type of cargo or a specific situation. For example, an empty container might need simpler, less expensive instrumentation than a container full of cargo.

The embedded power and data paths inside the containers preferably are accessible from external sources via inductive couplings, allowing for (a) recharging the power (batteries), (b) forming hard wired data and electrical paths, and (c) building a communication network within a stack composed entirely of composite containers, which can be used to count the number of the containers and detect the interposition of rogue containers in the stack. The security system may enable the automatic installation of different software modules immediately before a container is loaded and the use of several processors inside the container, which continuously check on one another and provide status and feedback information.

The container, in some examples, is an integral unit that includes four walls (a front wall, two end or side walls, and back wall), a roof (or top), a floor (or bottom). In one embodiment, the container has at least one door. According to another embodiment, the container preferably has at least two doors and one end. Again, in one arrangement, the doors include a coupling that permits the flow of optical and electrical data and electrical power to and from the doors. Additionally, or alternatively, a similar coupling may be used on the bottom of the container to permit the flow of optical and electrical data and electrical power to or from a similar (or complementary) coupling on the top of an adjacently positioned container, for example, or from a rack on which containers are stacked, or from a truck chassis on which a container is placed. Again, additionally, or alternatively, the adjacent complementary couples permit optical and/or electrical signal flow between and through various containers in a stack.

The data coupling incorporates a coupling mechanism that, if needed, withstands the harsh rigors of the maritime environment, where heavy containers may be stacked on top of one another and on truck chassis by crane. In an alternative embodiment, electrical couplings transferring power to a container by inductance is used with the container. Data is modulated over such a coupling to provide a data transfer method. For the door, optical signals/data can be coupled through butt joints of fiber optical paths, for example, or by effervescent light coupling.

In some arrangements, detectors for sensing special nuclear materials may be embedded into the composite panel walls. For example, relatively inexpensive domestic sensors may be embedded. In some conventional systems, special nuclear materials may be shielded. However, for sufficiently small container sizes, shielding may be impractical. In contrast, an appropriate number of small individual containers with embedded domestic sensors may provide a useful strategy for reducing the risk of nuclear weapons being imported through a maritime transport. Under this strategy, shipments that contain cargo in volumes that might be feasible for adequate shielding or special nuclear materials may need special handling.

In another application, after contents have been placed in a container, the container may be locked and sealed under control of a remote server. During this procedure, cryptographic material, randomly produced by the remote server may be uploaded into the container and stored in an appropriate FPGA or CPDL device embedded in one or more of the container walls.

When an unauthorized condition occurs, such as a breach of the container wall or an unscheduled opening of the container, the intrusion may be sensed by the embedded sensors internal of the container and embedded cryptographic material is partially or completely destroyed. Due to this procedure, an adversary may be unable to restore cryptographic material or determine the state of the container prior to the intrusion. Additionally, a signal or message may be sent to a remote server to indicate that an alarming condition has been detected. In some scenarios, the remote control server may ask for a hash of the previously supplied cryptographic values, to which, if an alarm has occurred, the container may be unable to supply that information.

Referring back, each individual container may include slots that are capable of receiving fork lift tongs to that the containers may be moved individually or as a stack. Since, as mentioned above, the contents and condition of a container or a stack of containers may be queried by a remote computer system via an embedded or attached data interface, containers and stacks of containers may be moved and inventoried while being monitored.

Other types of sensors and detectors may be incorporated into a container or a stack of containers. For example, a sensor may be included that determines the weight of the container and store data that represents this weight. Alternatively, a previously sealed container may be weighed by a separate device, and this information may then be stored in the container. Additionally, information such as data from domestic sensors, weight information, the supposed contents of the container, etc. may be fused together and processed to develop a metric to identify the likelihood that the container contains a nuclear device or other harmful contraband.

In general, commerce flows in world commerce are typically uneven, with more goods flowing in one direction than another. Consequently, the capability to ship disassembled containers is vital. Thereby, in some arrangements individual panels with embedded sensors may be shipped to particular locations (e.g., shipping ports, airports, etc.) for assembling at a later time. Since individual panels may be shipped separately, prior to assembling containers, the individual panels may be inserted into a rack for testing (e.g., pass a check-out procedure) by a remote server to determine if the panel is functioning correctly. Furthermore, composite containers may be partially or completely assembled in a rack for testing by a remote computer system to determine if the container is functioning properly.

A container rack may be implemented for various platforms and facilities. For example, a container rack may be designed and produced for positioning on truck chassis, a ship cargo compartment, a factory floor, etc. so that monitoring may continue during loading and off-loading periods and during transit. To provide power during these periods, the container rack may be designed to supply power (along with data connectivity) to a stack of containers (e.g. a stack of eight containers) that is held by the rack.

In some arrangements, a container that is produced from composite material may be produced in which the sides, the roof, the floor, the front and back, and doors may be disassembled into panels and reconstructed as needed. By manufacturing and distributing panels produced from composite material, the panels may be easily assembled at a shipping site into an appropriate container size. This container, once assembled, may be lighter than a similar container made of steel and may have more strength. Additionally, the container may be able to withstand the elements of a marine environment, and may be cost competitive.

In some arrangements, multiple composite containers may be vertically stacked so that an upper-positioned container securely mates with the container located directly below. By mating containers, a portion of a stack or a complete stack of containers may be lifted and moved as a single unit. This design has the advantage of reducing the cost of shipping empty containers back to the point of origin, because the disassembled parts are more compact for shipping purposes than the empty containers. This also reduces the risk of terrorists and other adversaries hiding people or contraband in empty containers. Another advantage is that refurbishment and maintenance is possible at the panel level rather than the container level. Discrete panels can be employed or not, depending on a user's desire to trade off advantages and disadvantages (such as a container made this way might not be as strong as a container manufactured as a unit, and the additional complexity of interfacing the electrical, optical, and power paths through walls composed of separate panels, and that such a device might be more easily reverse engineered by an adversary.

In some arrangements, the composite container may include an embedded wireless fidelity (WIFI) device that is capable of communicating externally without needing to rely on optical and electrical coupling. Furthermore, in some arrangements, the composite container includes an embedded telecommunication device (e.g., a radio frequency transceiver) for communicating with a loading crane and/or other ground- (or terminal-) based equipment.

According to another preferred embodiment, the sensors and processors of a stack of composite containers are interconnected and a data path and optionally an electrical path is formed by the interconnected containers, so that a system that includes the stacked composite containers is able to count the number of containers and detect the interposition of a rogue container that lacks conforming communication information and status information from that container, aid distribute electrical power to other containers as well.

According to another arrangement, the sensors and processors of multiple composite containers, which are stored in a stack, are interconnected and a data path is formed by the interconnected containers, so that a system that is formed by the sensors and processors of the stacked composite containers. This system of sensors and processors is able to count the number of containers and detect interposition of a rogue container that lacks conforming communication information and status information of the processors and sensors from that container. In another embodiment, the interchangeably conventional steel containers are provided with communication links and/or sensors and or processors, so that in a stack of containers, which includes both the composite containers and the steel containers, the steel containers can intercommunicate with the composite containers, and the composite containers and the steel containers form a communication network.

In some arrangements, two or more of the containers in a container stack are interconnected and thus form a communication network, which may be capable of counting the number of the containers and detecting the unauthorized inserting of a rogue container into a stack of containers on a platform such as a ship.

Composite containers (assembled above) may be vertically stacked upon one another. In some arrangements, an assembled container may mate with a container positioned below by using the flange and groove design described above. By mating the stacked containers, power and/or data connections may be made between the containers so that power and/or information may be passed among hardwire or wireless paths that interconnect the stacked containers.

A rack of stacked containers may be provided, as previously mentioned, in which each container is connected (directly or indirectly) to one or more remote servers (via the Internet) for sending and/or receiving information. In one scenario, this exemplary arrangement may be used to monitor the interposition of rogue containers in a stack of containers. Rogue containers are containers that are not remotely controlled, and, for example, may contain contraband such as nuclear weapon or toxic material. In some arrangements, a stack of containers and a rack may be designed to fit into a twenty-foot or forty-foot ISO shipping container. In this illustrative example, the containers are approximately four feet high so that a stack of two containers plus a rack may be inserted into a ten-foot high ISO container. If a rogue container, which is not connected to a remote server, is inserted into or positioned on top of the stack, the entire stack may not fit in the ISO container and thereby be detected. If a rogue container is interchanged with a container in the stack, due to absence of a connection with the remote server, the server may determine the present of the non-conforming container.

For a stack of ISO containers, the interposition of a non-conforming container into the middle of the stack may be relatively quickly detected by a remote controller that is connected to the stack through the Internet. Detection of a rogue container placed on top of the stack may be detected by incorporating a device (e.g., pressure sensor) that is connected to the stack and detects any non-conforming device placed on top of the stack. In other arrangements, this capability may be incorporated into the top side of composite containers used to in place of the conventional ISO shipping containers.

While this invention has been particularly shown and described with references to preferred embodiments thereof, it will be understood by those skilled in the art that various changes in form and details may be made therein without departing from the scope of the invention encompassed by the appended claims.

The principle and mode of operation of the invention have been described in its preferred embodiments. However, it should be noted that the invention described herein may be practiced otherwise than as specifically illustrated and described without departing from its scope.

What is claimed is:

1. A hybrid composite panel suitable for forming a container, the panel comprising:
   a wood layer; and
   a fiber-reinforced polymer composite layer having a sensor system embedded therein;
   wherein the sensor system includes an array of electrical conductors arranged in a serpentine configuration; and
   wherein the serpentine configuration includes at least one resistive bypass path interconnecting two points along the serpentine configuration.

2. The hybrid composite panel according to claim 1, wherein the sensor system includes an array of optical fibers.

3. The hybrid composite panel according to claim 2, wherein the array of optical fibers includes at least one fiber extending between two ends thereof, and arranged in a serpentine configuration.

4. The hybrid composite panel according to claim 3, wherein the sensor system further includes an optical signal generator coupled to the one end for generating an optical signal and an optical signal detector coupled to the other end for detecting the optical signal.

5. The hybrid composite panel according to claim 1, wherein the sensor system includes an electrical signal generator coupled to one end for generating the electrical signal and an electrical signal detector coupled to the other end for detecting the electrical signal.

6. The hybrid composite panel according to claim 1, wherein the wood layer is laminated plywood.

7. A hybrid composite panel suitable for forming a container, the panel comprising:
   a wood layer;
   a fiber-reinforced polymer composite layer having a sensor system embedded therein, wherein the sensor system includes an array of electrical conductors; and
   at least one resistive bypass path interconnecting two points in the array of electrical conductors.

* * * * *